United States Patent
Hayashi et al.

(10) Patent No.: US 6,812,071 B2
(45) Date of Patent: Nov. 2, 2004

(54) METHOD OF PRODUCING CRYSTALLINE SEMICONDUCTOR FILM AND SEMICONDUCTOR DEVICE FROM THE FILM

(75) Inventors: Masami Hayashi, Hyogo (JP); Masanao Kobayashi, Nagano (JP)

(73) Assignees: Renesas Technology Corp., Tokyo (JP); Seiko Epson Corporation, Tokyo (JP)

( * ) Notice: Subject to any disclaimer, the term of this patent is extended or adjusted under 35 U.S.C. 154(b) by 135 days.

(21) Appl. No.: 09/799,110

(22) Filed: Mar. 6, 2001

(65) Prior Publication Data

US 2001/0032980 A1 Oct. 25, 2001

(30) Foreign Application Priority Data

Mar. 7, 2000 (JP) .......................... 2000-062066

(51) Int. Cl.[7] .............................................. H01L 21/00
(52) U.S. Cl. .......................... 438/149; 438/47; 438/166
(58) Field of Search .................... 438/149, 47, 166, 438/10, 471–477, 937

(56) References Cited

U.S. PATENT DOCUMENTS

| | | | | |
|---|---|---|---|---|
| 4,636,280 A | * | 1/1987 | Nakai et al. ............... | 156/603 |
| 5,332,441 A | * | 7/1994 | Barnes et al. ............... | 118/723 |
| 5,466,953 A | * | 11/1995 | Rosbeck et al. ............. | 257/185 |
| 5,533,040 A | * | 7/1996 | Zhang .......................... | 372/25 |
| 5,746,829 A | * | 5/1998 | Matsunaga et al. ......... | 117/203 |
| 5,843,800 A | * | 12/1998 | Keller et al. .................. | 438/10 |
| 5,950,078 A | * | 9/1999 | Maekawa et al. ........... | 438/149 |
| 6,017,805 A | * | 1/2000 | DeBusk ........................ | 438/471 |
| 6,110,649 A | * | 8/2000 | Carter et al. ................. | 439/313 |
| 6,465,287 B1 | * | 10/2002 | Yamazaki et al. .......... | 438/162 |
| 6,472,229 B1 | * | 10/2002 | Aoki et al. ..................... | 438/3 |

FOREIGN PATENT DOCUMENTS

| | | | |
|---|---|---|---|
| JP | 62-262431 | * | 11/1987 |
| JP | 10-144923 | | 5/1998 |
| JP | 10-200120 | * | 7/1998 |
| JP | 2000-40828 | | 2/2000 |

* cited by examiner

Primary Examiner—Alexander Ghyka
(74) Attorney, Agent, or Firm—Leydig, Voit & Mayer, Ltd.

(57) ABSTRACT

A highly reliable semiconductor device is provided. The semiconductor device is provided with a thin film field-effect transistor having a channel region and includes a substrate and a semiconductor film. The semiconductor film is formed on the substrate and includes the channel region of the thin film field-effect transistor. An upper surface of the semiconductor film is planarized by removing a surface layer of the semiconductor film.

11 Claims, 18 Drawing Sheets

FIG.25
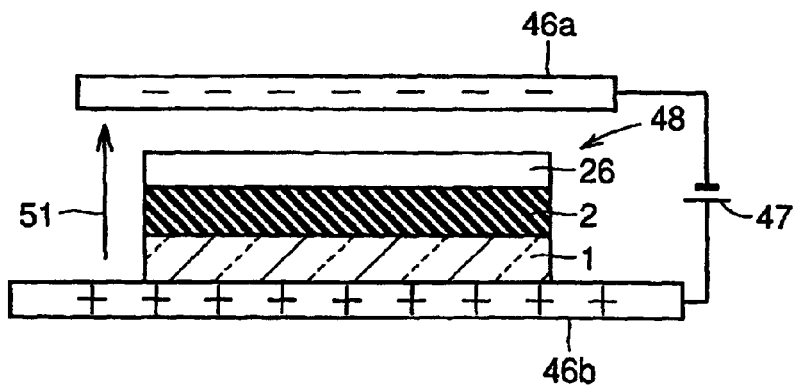
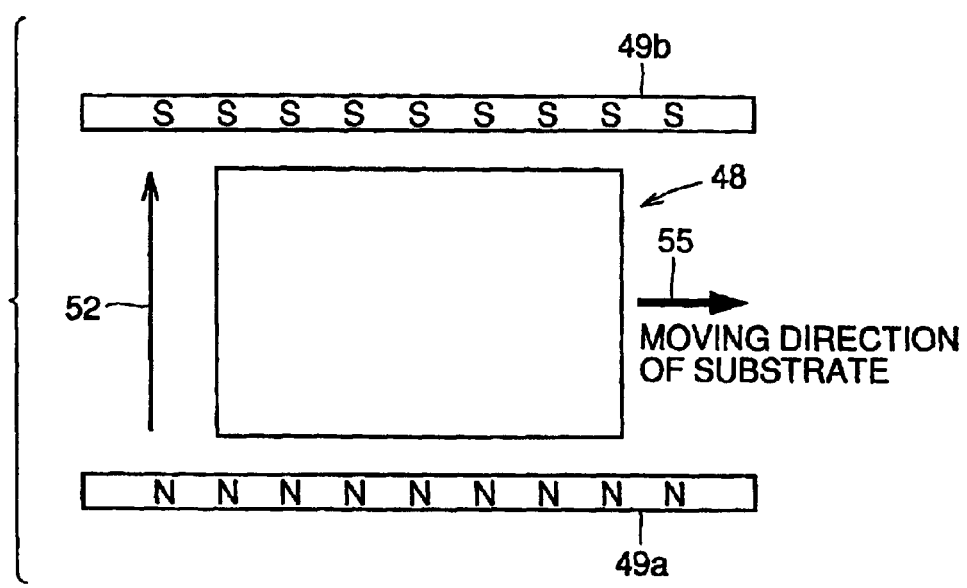
FIG.26

METHOD OF PRODUCING CRYSTALLINE SEMICONDUCTOR FILM AND SEMICONDUCTOR DEVICE FROM THE FILM

BACKGROUND OF THE INVENTION

1. Field of the Invention

The present invention relates to a semiconductor device, a method of producing the semiconductor device, a liquid crystal display device, and a method of producing the liquid crystal display device, and more specifically, to a semiconductor device that achieves high reliability, a method of producing the semiconductor device, a liquid crystal display device, and a method of producing the liquid crystal display device.

2. Description of the Background Art

Conventionally, a liquid crystal display device utilizing a thin film field-effect transistor is known to be one type of a liquid crystal display device. A glass substrate on which the thin film field-effect transistor is formed in such a liquid crystal display device is shown in FIG. 38. FIG. 38 is a schematic cross sectional view showing a conventional liquid crystal display device. The liquid crystal display device will be described with reference to FIG. 38.

As shown in FIG. 38, an n-type thin film field-effect transistor 119 and a p-type thin film field-effect transistor 120 are formed in a drive circuit region on a glass substrate 101 of the liquid crystal display device. In addition, a capacitance 121 and a thin film field-effect transistor for a pixel 122 are formed in a display pixel region.

An underlying film 102 is formed on glass substrate 101 in the drive circuit region. A silicon oxide film is used as the underlying film. On underlying film 102, n+ type impurity regions 103a, 103b, n− type impurity regions 104a, 104b, and a channel region 106a are formed using the same semiconductor film. An insulating film 107 serving as a gate insulating film is formed on channel region 106a. A gate electrode 108a is formed on gate insulating film 107. N+ type impurity regions 103a, 103b and n− type impurity regions 104a, 104b form source/drain regions. N+ type impurity regions 103a, 103b, n− type impurity regions 104a, 104b, channel region 106a, insulating film 107 located on channel region 106a, and gate electrode 108a formed an n-type thin film field-effect transistor 119.

In addition, on underlying film 102, p-type impurity regions 105a, 105b and a channel region 106b are formed using the same semiconductor film. Insulating film 107 serving as a gate insulating film is formed on channel region 106b. A gate electrode 108b is formed on insulating film 107 in the region located above channel region 106b. P-type impurity regions 105a, 105b, channel region 106b, insulating film 107 serving as the gate insulating film, and gate electrode 108b form a p-type thin film field-effect transistor 120. An interlayer insulating film 110 is formed on n-type thin film field-effect transistor 119 and p-type thin film field-effect transistor 120. Contact holes 111a to 111d are formed in regions located above n+ type impurity regions 103a, 103b and p-type impurity regions 105a, 105b by removing parts of interlayer insulating film 110 and insulating film 107. Metal interconnections 112a to 112d are formed such that they extend from inside contact holes 111a to 111d onto an upper surface of interlayer insulating film 110. A passivation film (not shown) is formed on metal interconnections 112a to 112d. A planarized film 113 is formed on the passivation film.

In the display pixel region, a capacitance electrode 109 is formed on underlying film 102. Another capacitance electrode 108e is formed on capacitance electrode 109 with insulating film 107 that serves as a dielectric film existing therebetween. Capacitance electrodes 109, 108e and insulating film 107 form capacitance 121. An n+ type impurity region 103c serving as a conductive region is formed on underlying film 102 adjacent to capacitance electrode 109.

Moreover, on underlying film 102, n+ type impurity regions 103d to 103f, n− type impurity regions 104d to 104g, and channel regions 106c, 106d are formed using the same semiconductor film. Gate electrodes 108c, 108d are formed on channel regions 106c, 106d with insulating film 107 serving as a gate insulating film existing therebetween. Thus, n+ type impurity regions 103d, 103e, n− type impurity regions 104d, 104e, channel region 106c, insulating film 107 serving as the gate insulating film, and gate electrode 108c form one thin film field-effect transistor. In addition, n+ type impurity regions 103e, 103f, n− type impurity regions 104f, 104g, channel region 106d, insulating film 107 serving as the gate insulating film, and gate electrode 108d form another thin film field-effect transistor. Thin film field-effect transistor for a pixel 122 includes these two thin film field-effect transistors.

Interlayer insulating film 110 is formed on capacitance 121 and thin film field-effect transistor for a pixel 122. Contact holes 111e to 111g are formed in regions located above n+ type impurity regions 103c, 103d, 103f by removing parts of interlayer insulating film 110 and insulating film 107. Metal interconnections 112e, 112f are formed such that they extend from inside contact holes 111e to 111g onto an upper surface of interlayer insulating film 110. A passivation film (not shown) is formed on metal interconnections 112e, 112f. Planarized film 113 is formed on the passivation film. A contact hole 114 is formed in planarized film 113 and the passivation film in the region located above metal interconnection 112e. A pixel electrode 115 using ITO (Indium Tin Oxide) and the like is formed such that it extends from inside contact hole 114 onto an upper surface of planarized film 113.

FIGS. 39 to 42 are schematic cross sectional views related to the description of a method of producing the liquid crystal display device shown in FIG. 38. The method of producing the liquid crystal display device will be described with reference to FIGS. 39 to 42.

First, underlying film 102 such as a silicon oxide film is formed on glass substrate 101. An amorphous silicon film 126 is formed on underlying film 102. Thus, the structure as the one shown in FIG. 39 can be obtained.

Then, amorphous silicon film 126 is annealed using a laser or the like to produce a polysilicon film 128. As a result, a structure such as the one shown in FIG. 40 is obtained.

Then, a resist film (not shown) is formed on polysilicon film 128. The resist film is subjected to exposure and development processes so as to form a channel pattern. Then, polysilicon film 128 is partially removed by etching using as a mask the resist film in which the channel pattern is formed so as to form polysilicon film 129a to 129d (see FIG. 41). Thereafter, the resist film is removed. Thus, the structure as the one shown in FIG. 41 is obtained.

Then, as shown in FIG. 42, a resist film 130 is formed in a region other than the region in which polysilicon film 129c is formed. Conductive impurities are implanted into polysilicon film 129c that is to become a capacitance electrode using resist film 130 as a mask to form capacitance electrode 109. Phosphorus ions 131 are used as the conductive impurities to be implanted at this time. Thereafter, resist film 130 is removed.

Then, insulating film 107 (see FIG. 38) is formed on polysilicon film 129a, 129b, 129d and capacitance electrode 109. A conductor film is formed on insulating film 107. A resist film is formed on this conductor film. The resist film is subjected to exposure and development processes so as to form a gate pattern. The conductive film is partially removed by etching using as a mask the resist film in which this gate pattern is formed so as to form gate electrodes 108a to 108d (see FIG. 38) and a capacitance electrode 108e (see FIG. 38). Thereafter, the resist film is removed. A resist film is formed so as to cover the region in which a p-type thin film field-effect transistor 120 (see FIG. 38) is to be formed, and, at the same time, a resist film that is to serve as a mask for forming n+ type impurity regions 103a to 103f (see FIG. 38) is formed so as to cover gate electrodes 108a, 108c, and 108d. Then, phosphorus ions as dopant impurities are implanted into prescribed regions of polysilicon film 129a, 129d and capacitance electrode 109. Thus, n+ type impurity regions 103a to 103f are formed. Thereafter, the resist film is removed.

Then, phosphorus ions are implanted into prescribed regions of polysilicon film 129a, 129d using gate electrodes 108a, 108c, 108d as a mask to form n-type impurity regions 104a, 104b, 104d to 104g (see FIG. 38). Then, a resist film is formed in a region other than the region in which p-type thin film field-effect transistor 120 is to be formed. Thereafter, boron ions, which are p-type conductivity dopant impurities are implanted into a prescribed region of polysilicon film 129b using gate electrode 108b as a mask so as to form p-type impurity regions 105a, 105b and a channel region 106b (see FIG. 38). Thereafter, the resist film is removed.

Then, interlayer insulating film 110 (see FIG. 38) is formed on gate electrodes 108a to 108d and capacitance electrode 108e. A resist pattern is formed on interlayer insulating film 110. Contact holes 111a to 111g (see FIG. 38) are formed by removing parts of interlayer insulating film 110 and insulating film 107 using this resist pattern as a mask. Thereafter, the resist pattern is removed. Then, after a washing step is performed, a metal layer that is to become metal interconnections 112a to 112f (see FIG. 38) is formed so as to extend from inside contact holes 111a to 111g onto an upper surface of interlayer insulating film 110. A resist pattern is formed on the metal layer. The metal layer is partially removed by wet etching using the resist pattern as a mask. Thus, metal interconnections 112a to 112f are formed. Thereafter, the resist pattern is removed.

A passivation film is formed on metal interconnections 112a to 112f. A planarized film 113 (see FIG. 38) is formed on the passivation film. After an upper surface of planarized film 113 is planarized, a contact hole 114 (see FIG. 38) is formed in planarized film 113 and the passivation film. A transparent conductor film such as an ITO film is formed to extend from inside contact hole 114 onto the upper surface of planarized film 113. A resist film in which a pixel pattern is formed is formed on the transparent conductor film. The transparent conductor film is partially removed by wet etching using the resist film as a mask to form a pixel electrode 115 (see FIG. 38). Thereafter, the resist film is removed. Thus, the structure such as the one shown in FIG. 38 is obtained.

In the step shown in FIG. 40, amorphous silicon film 126 (see FIG. 39) is annealed by irradiation with light from laser 127 and becomes a polysilicon film 128. This laser annealing step involves the following problems.

FIG. 43 is a schematic diagram related to the description of the conventional problems. As shown in FIG. 43, in some cases, contaminated regions 160a to 160d may exist in which impurities (contaminants) such as boron and arsenic or sodium and sulfur exist in such locations as on a surface of amorphous silicon film 126, in the boundary region between amorphous silicon film 126 and underlying film 102, in the boundary region between underlying film 102 and glass substrate 101, or inside glass substrate 101 and so on. When the laser annealing step as shown in FIG. 40 is performed with such contaminated regions 160a to 160d present, impurities from these contaminated regions 160a to 160d invade polysilicon film 128 during the laser annealing step, thereby creating the problem of increased impurity concentration m polysilicon film 128.

Conventionally, in order to solve such problems, it is suggested to employ a technique of forming a barrier layer made of a silicon nitride film between polysilicon film 128 and glass substrate 101 so as to prevent the introduction of impurities such as alkali ions from glass substrate 101. This barrier layer, however, has no effect on the impurities in the boundary portion between the barrier layer and amorphous silicon film 126 or on the impurities existing on the upper surface of amorphous silicon film 126. In other words, the above-described technique does not provide a solution to the above-described problems on a fundamental level.

Moreover, when polysilicon film 128 is contaminated by impurities after the laser annealing step, the presence of the impurities results in holes or electrons in a concentration greater than the set value being supplied in the channel region. As a result, threshold voltage fluctuation of a thin film field-effect transistor occurs, for instance, causing the electrical characteristics of the thin film field-effect transistor to change.

FIGS. 44 and 45 are schematic diagrams related to the description of the conventional problems. When a region 161 of an upper surface of polysilicon film 128 after the laser anneal step in FIG. 44 is partly enlarged, it can be seen that, in some cases, a silicon protrusion 137 is formed on a surface of polysilicon film 128 during the laser anneal step. The height of protrusion 137 from the substantially flat upper surface of polysilicon film 128 at times could become higher than the thickness of polysilicon film 128. With such protrusion 137 formed on the surface of polysilicon film 128, when insulating film 107 serving as a gate insulating film is formed on polysilicon film 128, the thickness of insulating film 107 becomes locally thin in the region located above protrusion 137. When the thickness of insulating film 107 serving as the gate insulating film becomes thin locally in this manner, dielectric breakdown is likely to occur in the portion having a small film thickness. As a result, the reliability of the thin film field-effect transistor is degraded. Moreover, such degradation of the reliability of the thin film field-effect transistor has caused a reduction in the yield of the liquid crystal display devices utilizing the thin film field-effect transistors as well as a variation in display characteristics in the display pixel region.

SUMMARY OF THE INVENTION

One object of the present invention is to provide a highly reliable semiconductor device and a method of producing such a semiconductor device.

Another object of the present invention is to provide a liquid crystal display device that achieves a high yield and that has good display characteristics and a method of producing such a liquid crystal display device.

According to one aspect of the present invention, a semiconductor device having a thin film field-effect transistor including a channel region includes a substrate and a semiconductor film. The semiconductor film is formed on the substrate, and includes the channel region of the thin film field-effect transistor. The semiconductor film has an upper surface that is planarized by the removal of a surface layer of the semiconductor film.

In this manner, the upper surface of the semiconductor film is planarized. Thus, the problem of the thickness of an insulating film serving as a gate insulating film formed on the channel region becoming locally thin due to the presence of a protrusion, as well as, the concentration of the electric field can be prevented. Consequently, the reduction in the dielectric strength of the gate insulating film can be prevented. As a result, a highly reliable semiconductor device can be obtained.

In addition, in the step of forming the semiconductor film, the impurities in the semiconductor film can be removed with certainty by concentrating or segregating the impurities within the semiconductor film into the surface layer and by removing this surface layer. In this manner, the threshold voltage fluctuation of a thin film field-effect transistor due to the impurities within the semiconductor film can be prevented. As a result, a semiconductor device having a thin film field-effect transistor of higher reliability can be obtained.

In the semiconductor device according to the above-described one aspect, an upper surface of the semiconductor film may include a protruded portion, and a height of the protruded portion from the substantially flat upper surface of the semiconductor film is preferably lower than a thickness of the semiconductor film.

If the semiconductor film is left as it is after the laser anneal processing, a protrusion having a height greater than the thickness of the semiconductor film might be formed on the upper surface of the semiconductor film. By removing the surface layer of the semiconductor film and planarizing the semiconductor film, however, the height of the protrusion (protruded portion) can be made lower than the thickness of the semiconductor film. Thus, a proportion of a decrease in the thickness of the gate insulating film formed on the semiconductor film can be reduced, and a concentration of the electric field can be prevented. As a result, the probability of dielectric breakdown in the gate insulating film can be reduced.

According to another aspect of the present invention, a semiconductor device having a thin film field-effect transistor including a channel region includes a substrate and a semiconductor film. The semiconductor film is formed on the substrate, includes a channel region of the thin film field-effect transistor, and is formed into a polycrystal by laser annealing. An upper surface of the semiconductor film includes a protruded portion. The height of the protruded portion from a substantially flat upper surface of the semiconductor film is lower than the thickness of the semiconductor film.

In this manner, a protruded portion having a relatively low height is formed on the upper surface of the semiconductor film so that, when a gate insulating film is formed on the semiconductor film, the proportion of the decrease in the thickness of the gate insulating film due to the presence of the protruded portion can be reduced, while the concentration of the electric field can be prevented. Consequently, the probability of dielectric breakdown caused by such reduction in the thickness of the gate insulating film can be decreased. As a result, a highly reliable semiconductor device can be obtained.

The liquid crystal display device according to a further aspect of the present invention includes a semiconductor device according to the above-described one aspect or the above-described another aspect.

Thus, high reliability of the liquid crystal display device can be achieved by using a thin film field-effect transistor of high reliability according to the present invention in a drive circuit region or a display pixel region of the liquid crystal display device, and at the same time, the probability of the defective products being produced can be reduced so that the yield can be improved. In addition, application of such a highly reliable semiconductor device as a pixel in the display pixel region improves the uniformity of the liquid crystal display screen.

According to a still further aspect of the present invention, a method of producing a semiconductor device having a thin film field-effect transistor including a channel region involves forming an amorphous semiconductor film on a substrate. The amorphous semiconductor film is subjected to a heat treatment to form a crystalline semiconductor film including a region that is to become the channel region. A surface layer of the crystalline semiconductor film is removed.

In this manner, even when a defect of form such as a protrusion is produced on a surface of the semiconductor film due to a heat treatment, such a defect of form portion can be removed by the removal of the surface layer of the crystalline semiconductor film. Thus, when a gate insulating film of a thin film field-effect transistor is formed on the semiconductor film, the problem of the thickness of the gate insulating film becoming locally thin due to the protrusion on the surface of the semiconductor film and the concentration of the electric field can be prevented. Consequently, a problem such as dielectric breakdown of the gate insulating film due to the thickness of the gate insulating film becoming locally thin can be prevented. As a result, a highly reliable semiconductor device can be obtained.

In the method of producing a semiconductor device according to the above-described still further aspect, a step of forming a crystalline semiconductor film preferably includes a high purity achieving step in which impurities within the semiconductor film are concentrated or segregated into a surface layer of the crystalline semiconductor film.

In this case, by performing a step of removing the surface layer, impurities within the semiconductor film concentrated or segregated into the surface layer can be removed from the semiconductor film at the same time. Thus, a semiconductor film having a low impurity concentration can be obtained. As a consequence, the problem of the threshold voltage fluctuation of a thin film field-effect transistor owing to impurity concentration in a channel region becoming unnecessarily high can be positively prevented. As a result, a highly reliable semiconductor device can be obtained.

In the method of producing a semiconductor device according to the above-described still further aspect, the high purity achieving step preferably includes lowering a temperature in a region adjacent to a substrate in an amorphous semiconductor film below a temperature of an upper surface layer in the amorphous semiconductor film during the heat treatment of the amorphous semiconductor film.

In this case, crystallization of the semiconductor film progresses from the region of the semiconductor film adjacent to the substrate during the heat treatment. An upper surface layer of the amorphous semiconductor film would be the last to undergo the crystallization in the semiconductor film. Moreover, impurities such as boron and arsenic concentrate or segregate in a grain boundary or the like of such region in which crystallization takes place last (surface layer of the crystalline semiconductor film). Thus, removal of the surface layer ensures removal of the impurities from the crystalline semiconductor film.

In the method of producing a semiconductor device according to the above-described still further aspect, the high purity achieving step preferably includes applying an electric field to the amorphous semiconductor film during heat treatment of the amorphous semiconductor film.

In this case, impurities can move within the semiconductor film relatively easily during the heat treatment of the amorphous semiconductor film. When impurities exist as ions having positive or negative electric charges, an electric field can be applied substantially in the vertical direction to an upper surface of the semiconductor film with the direction of the electric field controlled so as to move the impurity ions having charges of a desired sign in a direction of a surface layer of the semiconductor film. In other words, it becomes possible to accelerate the concentration or the segregation of the impurity ions into the surface layer of the semiconductor film. In addition, the impurity ions that are positive or negative can be selectively concentrated or segregated to the surface layer of the semiconductor film according to the sign of charge so that the impurity ions can be removed from the semiconductor film selectively according to the sign of electric charge.

In the method of producing a semiconductor device according to the above-described still further aspect, the crystalline semiconductor film is preferably subjected to a further heat treatment while applying an electric field of a direction that is opposite to the direction of the electric field in the above high purity achieving step to the crystalline semiconductor film whose surface layer is removed. A surface layer of the crystalline semiconductor film subjected to the further heat treatment is preferably further removed.

Let us consider the case in which the impurity ions having positive charges, for instance, are concentrated or segregated into the surface layer of the semiconductor film in the initial high purity achieving step and thereby removed. By performing the further heat treatment while applying the electric field of the opposite direction to that in the initial high purity achieving step, the impurity ions having negative charges can be concentrated or segregated into the surface layer of the semiconductor film. The further removal of the surface layer of the semiconductor film subjected to the further heat treatment ensures the removal of these impurity ions having negative charges from the semiconductor film. As a result, the removal of both the impurity ions having positive charges and the impurity ions having negative charges from the semiconductor film can be ensured. Thus, a decrease in concentration of impurities within the semiconductor film can be ensured so that such problems as a threshold voltage fluctuation of the thin film field-effect transistor due to these impurities can be prevented.

In the method of producing a semiconductor device according to the above-described still further aspect, the high purity achieving step preferably includes applying a magnetic field to the amorphous semiconductor film during the heat treatment of the amorphous semiconductor film.

In this case, when a substrate on which the amorphous semiconductor film is formed is subjected to the heat treatment, the substrate is moved in the horizontal direction, for instance, and a magnetic field which is parallel to the surface of the substrate and vertical to the moving direction of the substrate is applied to the amorphous semiconductor film. In this manner, the impurity ions would move according to the movement of the substrate so that the impurity ions would be subjected to a force (Lorentz's force) in a direction substantially vertical to the surface of the semiconductor film or a thickness direction of the amorphous semiconductor film. As a result, as in the case in which an electric field is applied described above, it becomes possible to concentrate or segregate the impurity ions having charges of a desired sign into the surface layer of the semiconductor film.

In addition, although a device such as an electrode need to be arranged above the amorphous film when an electric field is to be applied, a device for applying a magnetic field can be arranged in a region other than above the substrate when the magnetic field is to be applied in the horizontal direction of the substrate as described above. Consequently, no extra device is arranged above the substrate so that a laser beam and the like can be irradiated onto the semiconductor film with ease. As a result, heat treatment such as laser annealing can be performed easily.

In the method of producing a semiconductor device according to the above-described still further aspect, the crystalline semiconductor film is preferably subjected to a further heat treatment while applying a magnetic field in a direction opposite to the direction of the magnetic field in the high purity achieving step to the crystalline semiconductor film whose surface layer is removed. A surface layer of the crystalline semiconductor film subjected to the further heat treatment is preferably further removed.

In this case, a magnetic field of the direction opposite to the magnetic field in the above-described high purity achieving step is applied during the further heat treatment of the semiconductor film so that the impurity ions having charges of the conductivity type reverse of the impurity ions concentrated or segregated into the surface layer of the semiconductor film in the high purity achieving step can be concentrated or segregated into a surface layer of the semiconductor film. Thus, the removal of both the impurity ions having positive charges and the impurity ions having negative charges within the semiconductor film from the semiconductor film can be ensured.

In the method of producing a semiconductor device according to the above-described still further aspect, the high purity achieving step preferably involves applying a centrifugal force to the amorphous semiconductor film during the heat treatment of the amorphous semiconductor film.

In this manner, by applying a centrifugal force in a direction substantially vertical to a surface of the semiconductor film, the impurities can be easily concentrated or segregated into the surface layer of the semiconductor film due to a difference in specific gravities of material forming the semiconductor film and the impurities. For instance, when the amorphous semiconductor film is subjected to the heat treatment and attains a molten state, the centrifugal force applied in a direction toward the substrate from the upper surface of the semiconductor film can cause the impurities having a smaller specific gravity than the material forming the semiconductor film to concentrate or segregate into an upper surface side (surface layer) of the semiconductor film within the semiconductor film in the molten state. If the surface layer of the semiconductor film is removed thereafter, the removal of an impurity element having a relatively small specific gravity from the semiconductor film can be ensured. Moreover, by reversing the direction in which the centrifugal force is applied, impurities having a greater specific gravity than the material forming the semiconductor film can be easily concentrated or segregated into the surface layer of the semiconductor film. In other words, according to the direction in which the centrifugal force is applied, either the impurities having a smaller specific gravity or the impurities having a greater specific gravity than the material forming the semiconductor film can be selectively removed.

In the method of producing a semiconductor device according to the above-described still further aspect, the crystalline semiconductor film is preferably subjected to a further heat treatment while applying a centrifugal force in a direction that is opposite to the direction of the centrifugal force in the above-described high purity achieving step to the crystalline semiconductor film whose surface layer is removed. A surface layer of the crystalline semiconductor film subjected to the further heat treatment is preferably further removed.

In this case, the removal of both the impurities having a relatively small specific gravity and the impurities having a relatively large specific gravity with respect to the material forming the semiconductor film from the semiconductor film can be ensured. As a result, the threshold voltage fluctuation of the thin film field-effect transistor due to the presence of the impurities can be positively prevented.

In the method of producing a semiconductor device according to the above-described still further aspect, in the high purity achieving step, at least two steps are preferably performed during heat treatment of the amorphous semiconductor film which are selected from the group consisting of lowering the temperature in the region adjacent to the substrate in the amorphous semiconductor film below the temperature of an upper surface layer in the amorphous semiconductor film, applying an electric field to the amorphous semiconductor film, applying a magnetic field to the amorphous semiconductor film, and applying a centrifugal force to the amorphous semiconductor film.

In this case, a plurality of measures are implemented in order to concentrate or segregate the impurities in one high purity achieving step so that the impurities can be concentrated or segregated into the surface layer of the semiconductor film with greater certainty. As a result, the reduction in the impurity concentration within the semiconductor film can be ensured.

In the method of producing a semiconductor device according to the above-described still further aspect, prior to the step of removing a surface layer of the crystalline semiconductor film, a semiconductor film portion including a region to be the channel region and including a surface layer of the semiconductor film is preferably formed by partially removing the crystalline semiconductor film by etching.

Let us consider the case in which a resist film to be used as an etching mask is formed in the step of forming the semiconductor film portion. After forming the semiconductor film portion, even if such resist film remains on the semiconductor film portion, the remaining portion of such resist film can be removed along with a surface layer of the semiconductor film since the step of removing the surface layer of the semiconductor film is performed after the step of forming the semiconductor film portion. Consequently, such resist film is prevented from remaining on the semiconductor film portion. As a result, a structural defect of a thin film field-effect transistor due to the remaining resist film as described above can be prevented.

In addition, when impurities or foreign particles exist in a region other than the region in which the semiconductor film portion is formed after the step of forming the semiconductor film portion, these foreign particles can also be removed during the step of removing the surface layer of the semiconductor film. As a result, the prevention of a structural defect of a semiconductor device due to the presence of such foreign particles can be ensured.

In the method of producing a semiconductor device according to the above-described still further aspect, the step of forming the semiconductor film portion preferably includes a step of forming another semiconductor film portion by partially removing the semiconductor film by etching, and conductive impurities are preferably implanted into the above another semiconductor film portion prior to the step of removing the surface layer of the semiconductor film.

At this time, let us consider the case in which a resist film is formed on the semiconductor film as a mask for a step of implanting the conductive impurities. In such a case, this resist film at times could remain on the semiconductor film even after the step of removing the resist film. According to the present invention, however, the surface layer of the semiconductor film is removed after the step of implanting the conductive impurities so that the remaining portion of the resist film can be removed at the same time as the surface layer of the semiconductor film. Consequently, such problem as the remaining resist film can be positively prevented. As a result, a structural defect of a semiconductor device due to the remaining resist film can be prevented.

Moreover, in some cases, a defect could be produced in the surface layer of the semiconductor film owing to such steps as implanting the conductive impurities and removing the resist film as described above. Since the surface layer of the semiconductor film is removed after the step of implanting the conductive impurities, however, such defect portion in the surface layer of the semiconductor film can be removed from the semiconductor film. As a result, the degradation in the electrical characteristics of a thin film field-effect transistor due to the presence of such defect portion in the semiconductor film can be prevented.

According to an even further aspect of the present invention, a method of producing a semiconductor device having a thin film field-effect transistor including a channel region involves forming an amorphous semiconductor film on a substrate. An impurity absorption film is formed on the amorphous semiconductor film. The amorphous semiconductor film with the impurity absorption film formed thereon is subjected to a heat treatment to form a crystalline semiconductor film including a region that is to become the channel region. The impurity absorption film is removed.

In this manner, the impurity absorption film is formed in advance so that a portion of the semiconductor film need not be removed after concentrating or segregating the impurities. In other words, the deposited film thickness of the amorphous semiconductor film can be made thinner than that in the method of producing a semiconductor device according to the above-described still further aspect. Moreover, when employing a laser for the heat treatment, an output (power) of the laser needs to be increased in proportion to the film thickness of the amorphous semiconductor film to be subjected to the heat treatment; however, the heat treatment using a laser having a relatively small output becomes possible when the thickness of the amorphous semiconductor film is reduced. As a result, a reduction in the manufacturing cost of the semiconductor device can be achieved.

In the method of producing a semiconductor device according to the above-described even further aspect, prior to the step of removing the impurity absorption film, a semiconductor film portion including a region that is to become the channel region is preferably formed by partially removing the crystalline semiconductor film and the impurity absorption film by etching.

When a resist film is used as a mask in the etching for forming the semiconductor film portion, in some cases, the resist film may remain on the semiconductor film upon the removal of the resist film after the etching. Since the impurity absorption film is removed after forming the semiconductor film portion, however, the resist film remaining on the impurity absorption film can be removed at the same time. As a result, the problem of a structural defect of a thin film field-effect transistor due to the remaining resist film can be prevented.

In addition, the impurity absorption film is removed after the step of forming the semiconductor film portion so that, even when foreign particles and the like exist in the region other than the region in which the semiconductor film portion remains, these foreign particles can be removed at the same time in the step of removing the impurity absorption film. As a result, the defect of a semiconductor device due to the presence of such foreign particles can be prevented.

In the method of producing a semiconductor device according to the above-described even further aspect, the step of forming the semiconductor film portion preferably includes a step of forming another semiconductor film portion by partially removing the crystalline semiconductor film and the impurity absorption film by etching, and prior to the step of removing the impurity absorption film, a step of implanting conductive impurities into the above another semiconductor film portion is preferably provided.

Now, let us consider the case in which a resist film is formed as a mask to be used in the step of implanting the conductive impurities. In such a case, this resist film at times could remain on the semiconductor film and the like when the resist film is removed after the step of implanting the conductive impurities. The presence of such remaining resist film at times could cause a structural defect in the semiconductor device. By removing the impurity absorption film after the step of implanting the conductive impurities, however, the remaining portion of the resist film can be removed at the same time as the removal of the impurity absorption film. As a result, the prevention of a structural defect of the semiconductor device due to the remaining resist film can be ensured.

In addition, an ashing processing or the like normally performed in such step of removing the resist film can cause damage to the semiconductor film portion in some cases. The impurity absorption film, however, serves as the protection film to prevent the damage to the semiconductor film portion from such ashing process. Thus, the prevention of a defect in the semiconductor film portion caused by such ashing process can be ensured.

According to another still further aspect of the present invention, a method of producing a liquid crystal display device employs the method of producing a semiconductor device according to the above-described still further aspect or the method of producing a semiconductor device according to the above-described even further aspect.

In this manner, a liquid crystal display device having a semiconductor device such as a highly reliable thin film field-effect transistor and the like can be easily obtained.

Moreover, the application of such a highly reliable thin film field-effect transistor to a drive circuit or a display pixel of the liquid crystal display device improves the reliability of the liquid crystal display device and, at the same time, achieves uniformity of display characteristics of the liquid crystal display device. Furthermore, since highly reliable thin film field-effect transistors are used, the yield of the liquid crystal display devices can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 24 to 28 are schematic diagrams respectively showing third to seventh embodiments of the method of producing a liquid crystal display device according to the present invention.

DESCRIPTION OF THE PREFERRED EMBODIMENTS

Figure 1:
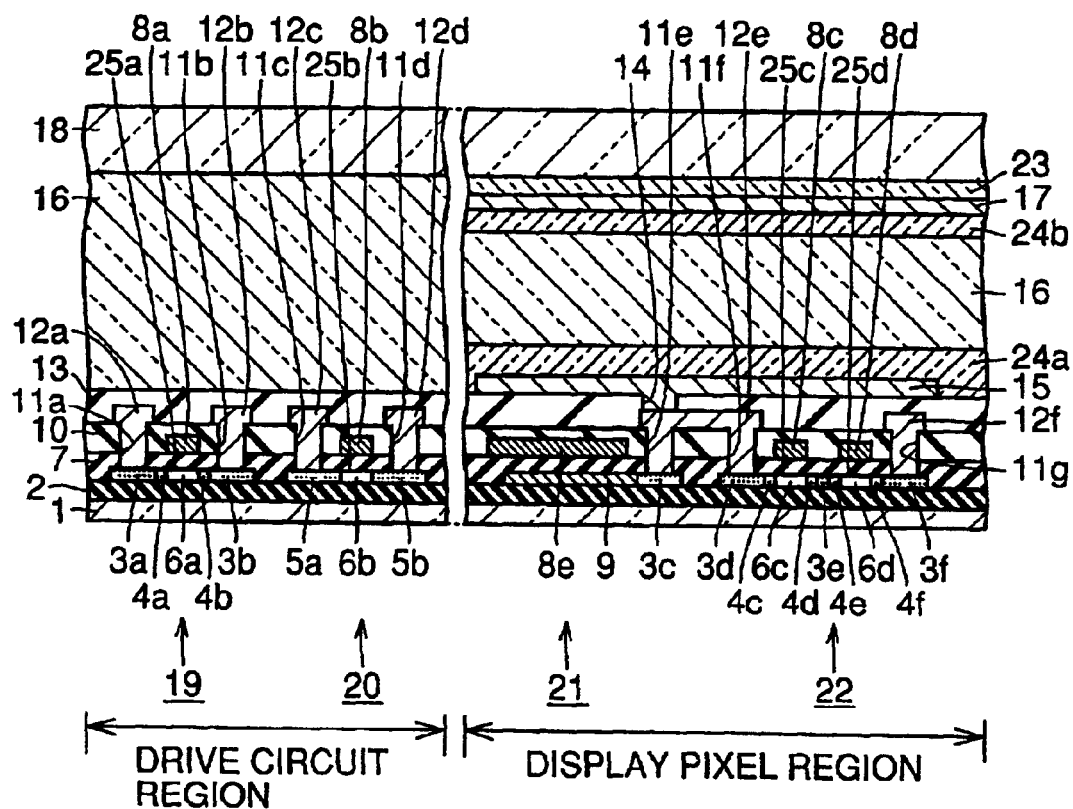
FIG. 1 is a schematic cross sectional view representing a first embodiment of a liquid crystal display device according to the present invention.

The embodiments of the present invention will be described below based on the drawings. Moreover, the same or corresponding parts are denoted by the same reference characters throughout the drawings, and the description thereof will not be repeated.

First Embodiment

The first embodiment of the liquid crystal display device according to the present invention will be described with reference to FIG. 1.

As shown in FIG. 1, in the liquid crystal display device, an underlying film 2 is formed on a glass substrate 1 in a drive circuit region. An n-type thin film field-effect transistor 19 and a p-type thin film field-effect transistor 20 are formed on underlying film 2. N-type thin film field-effect transistor 19 includes n+ type impurity regions 3a, 3b which are high concentration impurity regions, n− type impurity regions 4a, 4b which are low concentration impurity regions, a channel region 6a, an insulating film 7 serving as a gate insulating film, and a gate electrode 8a. N+ type impurity regions 3a, 3b and n− type impurity regions 4a, 4b form source/drain regions having an LDD (Lightly Doped Drain) structure. N+ type impurity regions 3a, 3b, n− type impurity regions 4a, 4b, and channel region 6a are formed using the same semiconductor film on underlying film 2. Gate electrode 8a is formed in a region located above channel region 6a with insulating film 7 existing therebetween.

In addition, p-type thin film field-effect transistor 20 includes p-type impurity regions 5a, 5b serving as source/drain regions, a channel region 6b, insulating film 7 serving as a gate insulating film, and a gate electrode 8b. On underlying film 2, p-type impurity regions 5a, 5b and channel region 6b are formed using the same semiconductor film. Gate electrode 8b is formed in the region located above channel region 6b with insulating film 7 existing therebetween. An interlayer insulating film 10 is formed on gate electrodes 8a, 8b. Contact holes 11a to 11d are formed in regions located above n+ type impurity regions 3a, 3b and p-type impurity regions 5a, 5b by removing parts of interlayer insulating film 10 and insulating film 7 by etching. Metal interconnections 12a to 12d are formed such that they extend from inside contact holes 11a to 11d onto an upper surface of interlayer insulating film 10. A passivation film (not shown) is formed on metal interconnections 12a to 12d. A planarized film 13 is formed on the passivation film.

In the display pixel region, a capacitance 21 and a thin film field-effect transistor for a pixel 22 are formed. Capacitance 21 includes capacitance electrodes 9, 8e and insulating film 7 serving as a dielectric film. Capacitance electrode 9 is formed on underlying film 2. Capacitance electrode 8e is formed in a region located above capacitance electrode 9 with insulating film 7 existing therebetween. An n+ type impurity region 3c is formed in a portion adjacent to capacitance electrode 9.

In addition, thin film field-effect transistor for a pixel 22 includes first and second thin film field-effect transistors. The first thin film field-effect transistor has n+ type impurity regions 3d, 3e which are high concentration impurity regions, n− type impurity regions 4c, 4d which are low concentration impurity regions, a channel region 6c, an insulating film 7 serving as a gate insulating film, and a gate electrode 8c. The second thin film field-effect transistor has n+ type impurity regions 3e, 3f which are high concentration impurity regions, n+ type impurity regions 4e, 4f which are low concentration impurity regions, a channel region 6d, insulating film 7 serving as a gate insulating film, and a gate electrode 8d.

Underlying film 2 is formed on glass substrate 1. N+ type impurity regions 3d to 3f formed using the same semiconductor film, n− type impurity regions 4c to 4f, and channel regions 6c, 6d are formed on underlying film 2. Insulating film 7 serving as the gate insulating film is formed on channel regions 6c, 6d. Gate electrodes 8c, 8d are formed on insulating film 7 in regions located above channel regions 6c, 6d.

Interlayer insulating film 10 is formed on capacitance 21 and thin film field-effect transistor for a pixel 22. Contact holes 11e to 11g are formed in regions located above n+ type impurity regions 3c, 3d, 3f by removing parts of interlayer insulating film 10 and insulating film 7. Metal interconnections 12e, 12f are formed such that they extend from inside contact holes 11e to 11g onto an upper surface of interlayer insulating film 10. A passivation film (not shown) is formed on metal interconnections 12e, 12f. Planarized film 13 is formed on the passivation film. A contact hole 14 is formed in a region located on metal interconnection 12e by removing parts of planarized film 13 and the passivation film. A pixel electrode 15 made of a transparent conductor film such as of ITO is formed such that it extends from inside contact hole 14 onto an upper surface of planarized film 13. An alignment film 24a is formed on pixel electrode 15.

An upper glass substrate 18 is disposed so as to face glass substrate 1 on which n-type thin film field-effect transistor 19, p-type thin film field-effect transistor 20, capacitance 21, and thin film field-effect transistor for a pixel 22 are formed as described above. A color filter 23 is formed on upper glass substrate 18 on a surface facing glass substrate 1. An opposite electrode 17 is formed on color filter 23 on a surface facing glass substrate 1. An alignment film 24b is formed on opposite electrode 17 on a surface facing glass substrate 1. Moreover, liquid crystal 16 is injected and sealed between glass substrate 1 and upper glass substrate 18.

In the liquid crystal display device shown in FIG. 1, a surface layer (an upper surface layer) of channel regions 6a to 6d are partially removed by a prescribed film thickness as will be shown in the production method described below. Thus, even when a protrusion which is larger than the film thickness of channel regions 6a to 6d is formed on upper surfaces 25a to 25d of channel regions 6a to 6d due to an anneal step and the like, the protrusion can be removed at the same time as the surface layer. In other words, no protrusion as the one described above would remain on the upper surfaces of channel regions 6a to 6d. Thus, the problem of the film thickness of insulating film 7 becoming locally reduced due to the presence of such protrusion can be prevented. As a result, the prevention of dielectric breakdown in insulating film 7 serving as a gate insulating film of a thin film field-effect transistor can be ensured.

A method of producing a liquid crystal display device will be described with reference to FIGS. 2 to 17.

Figure 2:
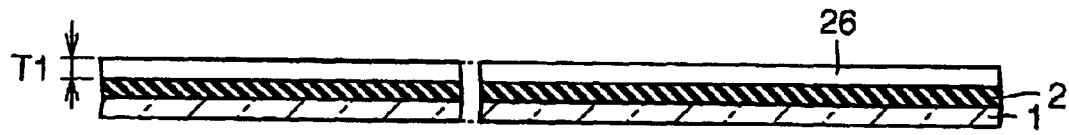
FIGS. 2 to 17 are schematic cross sectional views respectively showing first to sixteenth steps of a method of producing the liquid crystal display device shown in FIG. 1.

First, as shown in FIG. 2, underlying film 2 is deposited on glass substrate 1. A silicon oxide film is used as underlying film 2. An amorphous silicon film 26 having a film thickness T1 which is an amorphous semiconductor film is formed on underlying film 2.

Figure 3:
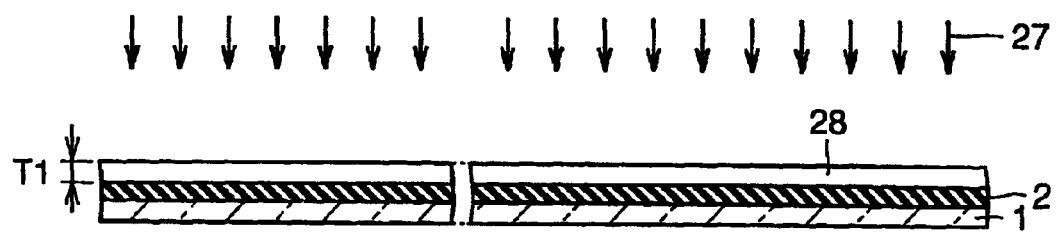
Figure 18:
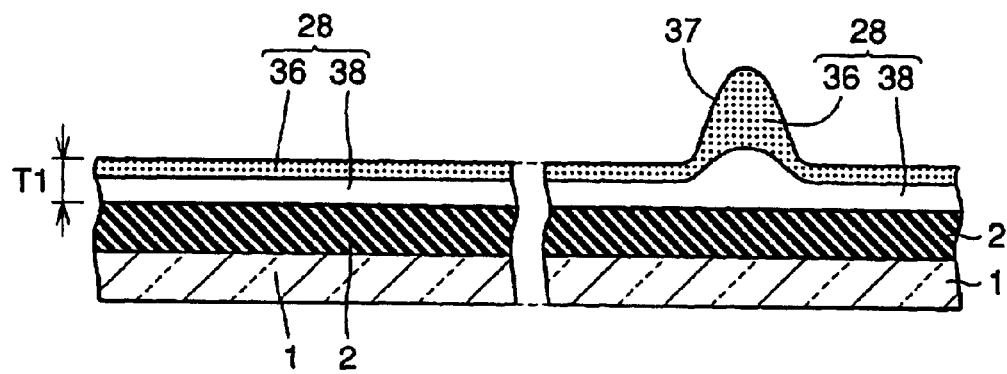
FIG. 18 is a schematic partial cross sectional view showing the state of a polysilicon film after the laser annealing process shown in FIG. 3.

Then, as shown in FIG. 3, laser 27 is irradiated on amorphous silicon film 26 (see FIG. 2) to perform laser anneal processing. As a result, amorphous silicon film 26 becomes a polysilicon film 28 which is a crystalline semiconductor film. Laser 27 can be irradiated using the following conditions: for instance, using an XeCl excimer laser, with the size of the region of laser irradiation being 150 mm×400 μm, at the overlap rate of 95%, in the atmosphere, and at room temperature. After the laser anneal processing, polysilicon film 28 attains the state shown in FIG. 18. FIG. 18 is a schematic partial cross sectional view illustrating the state of polysilicon film 28 after the laser anneal processing shown in FIG. 3.

As shown in FIG. 18, laser 27 (see FIG. 3) is irradiated from the upper surface side of polysilicon film 28, and glass substrate 1 and underlying film 2 perform the function of a heat sink or the like for polysilicon film 28. Consequently, after amorphous silicon film 26 is irradiated by the laser and thus attains the molten state, the solidifying reaction of it becoming polysilicon film 28 gradually progresses from the interface region (a lower portion of polysilicon film 28) where polysilicon film 28 and underlying film 2 make contact toward the upper surface side of polysilicon film 28. In other words the crystallization takes place last in the upper surface layer which is a surface layer of polysilicon film 28. In addition, impurities such as boron and arsenic concentrate or segregate at the grain boundary and the like of such region in which crystallization takes place last. This is because impurities such as boron or arsenic within polysilicon film 28 are gradually concentrated into the portion in the molten state and not in the portion of crystallized polysilicon. In this manner, when the solidification (crystallization) of polysilicon film 28 is finally completed, in polysilicon film 28, two layers consisting of a low impurity concentration layer 38 which is located in a region close to underlying film 2 within polysilicon film 28 and which has a lowered impurity concentration, and an impurity concentrated layer 36 which is located in a region close to the surface layer of polysilicon film 28 and in which impurities are concentrated or segregated are formed as shown in FIG. 18.

Moreover, as shown in FIG. 18, in some cases, a protrusion 37 is formed on a surface of polysilicon film 28 in the solidification process of the laser anneal method. At this time, the height of protrusion 37 from the substantially flat upper surface of polysilicon film 28 is greater than the film thickness of polysilicon film 28 in its flat portion.

Figure 19:
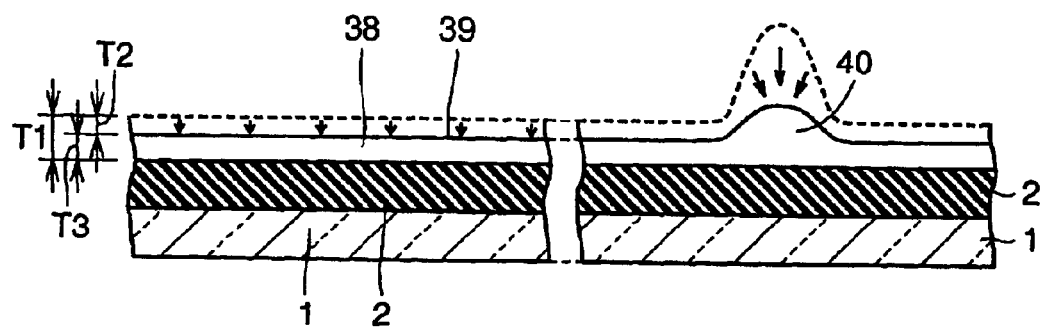

After the laser anneal step shown in FIG. 3, the surface layer of polysilicon film 28 is partially removed by dry etching. As a result, the thickness of polysilicon film 28 becomes T3. At this time, as shown in FIG. 19, impurity concentrated layer 36 which forms the surface layer of polysilicon film 28 is removed by this dry etching. As a result, the remaining polysilicon film 28 is mostly formed by low impurity concentration layer 38. Thus, the impurity concentration of polysilicon film 28 can be reduced. FIG. 19 is a schematic partial cross sectional view of the polysilicon film in the step shown in FIG. 4.

In addition, processing conditions such as the following, for instance, was employed in the dry etching step for partially removing the surface layer of polysilicon film 28: with carbon tetrafluoride gas ($CF_4$) and oxygen gas ($O_2$) used as reactive gases in the dry etching, and a flow rate of carbon tetrafluoride gas set to 0.15 liter/min (150 sccm) and a flow rate of oxygen gas set to 0.02 liter/min (20 sccm). Moreover, the RF power was set to 1500 W, and the etching time was 10 seconds.

Surface roughness (initial roughness) of polysilicon film 28 before dry etching was about 8 nm by Ra; however, by partially removing a surface layer of polysilicon film 28 by a dry etching step as described above, it was possible to reduce the surface roughness of polysilicon film 28 after the dry etching to 4 to 6 nm by Ra. Moreover, the surface roughness of polysilicon film 28 was measured using an atomic force microscope (AFM). In addition, the surface roughness of polysilicon film 28 after etching can be further reduced by increasing the etching time further. For instance, by setting the etching time to about 15 seconds to 20 seconds, it is possible to reduce the surface roughness of polysilicon film 28 to about 2 to 4 nm by Ra.

Variation in electrical characteristics of a thin film field-effect transistor utilizing polysilicon film 28 as a channel region can be made sufficiently small by reducing the surface roughness of polysilicon film 28 to about 4 to 6 nm as described above.

In addition, if the etching using plasma is performed as the dry etching, an electric field is concentrated on protrusion 37 so that protrusion 37 is selectively etched. Consequently, the greater part of protrusion 37 would be removed by etching as shown in FIG. 19. Moreover, on upper surface 39 of polysilicon film 28, a protruded portion 40 remains in the position in which protrusion 37 existed. The height of protruded portion 40 from the substantially flat upper surface 39 of polysilicon film 28 is sufficiently low in comparison with the thickness of polysilicon film 28 in its flat portion.

Thus, by removing the surface layer of polysilicon film 28 by dry etching after laser annealing, impurity concentrated layer 36 in which impurities within polysilicon film 28 are concentrated or segregated can be removed so that the impurity concentration of the remaining polysilicon film 28 can be reduced as described above. Consequently, the impurity concentration of channel regions 6a to 6d (see FIG. 1) formed using polysilicon film 28 can be kept sufficiently low. As a result, the problem of threshold voltage fluctuation of a thin film field-effect transistor formed due to the presence of impurities in channel regions 6a to 6d can be effectively prevented.

In addition, by performing dry etching, protrusion 37 on the upper surface of polysilicon film 28 that is to become channel regions 6a to 6d can be removed. Thus, local thinning of the thickness of insulating film 7 serving as the gate insulating film formed on polysilicon film 28 due to the presence of protrusion 37 can be prevented. Therefore, the dielectric breakdown in the gate insulating film of a thin film field-effect transistor due to the local thinning of the thickness of insulating film 7 can be prevented. As a result, a highly reliable thin film field-effect transistor can be obtained. Moreover, by using such a highly reliable thin film field-effect transistor as a device for a drive circuit or the display pixel region of a liquid crystal display device, the liquid crystal display device having high reliability and excellent display characteristics can be obtained.

Figure 4:
Figure 5:

After the step shown in FIG. 4, a resist film (not shown) is formed on polysilicon film 28. Using this resist film as a mask, polysilicon film 28 is partially removed to form polysilicon film 29a to 29d as shown in FIG. 5. Thereafter, the resist film is removed. Thus, the structure as the one shown in FIG. 5 is obtained.

Figure 6:
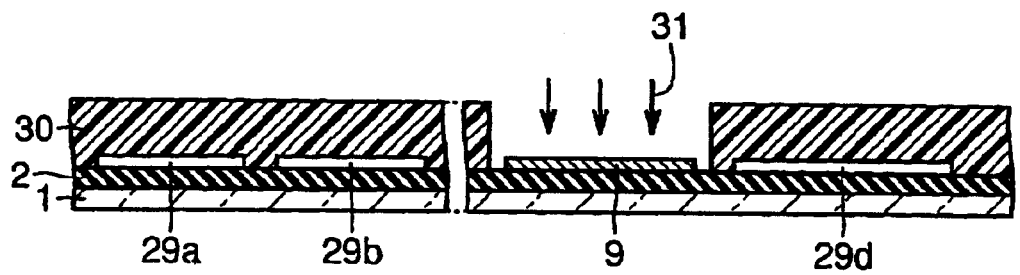

Then, as shown in FIG. 6, a resist film 30 is formed in a region other than the region in which capacitance 21 is to be formed. Using resist film 30 as a mask, phosphorus ions 31 are implanted into polysilicon film 29c (see FIG. 5) to form a capacitance electrode 9. Thereafter, resist film 30 is removed.

Figure 7:
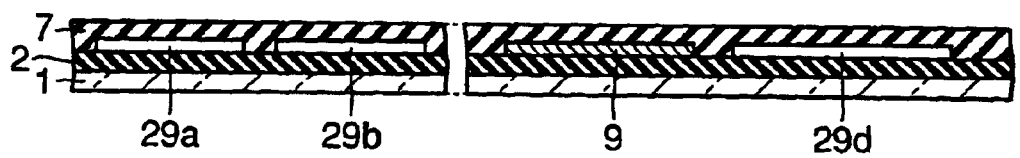

Then, as shown in FIG. 7, an insulating film 7 is formed on capacitance electrode 9 and polysilicon film 29a, 29b, 29d.

Figure 8:
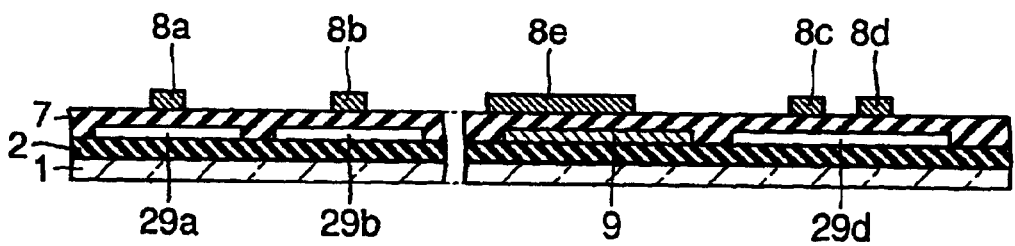

Then, a conductor film (not shown) formed of a chromium film or the like is formed on insulating film 7. A resist film is formed on this conductor film. A gate pattern is formed by performing exposure and development processes on the resist film. Using as a mask the resist film in which this gate pattern is formed, the conductor film is partially removed by wet etching so as to form gate electrodes 8a to 8d and a capacitance electrode 8e (see FIG. 8). Thereafter, the resist film is removed. Thus, the structure as the one shown in FIG. 8 is obtained.

Figure 9:
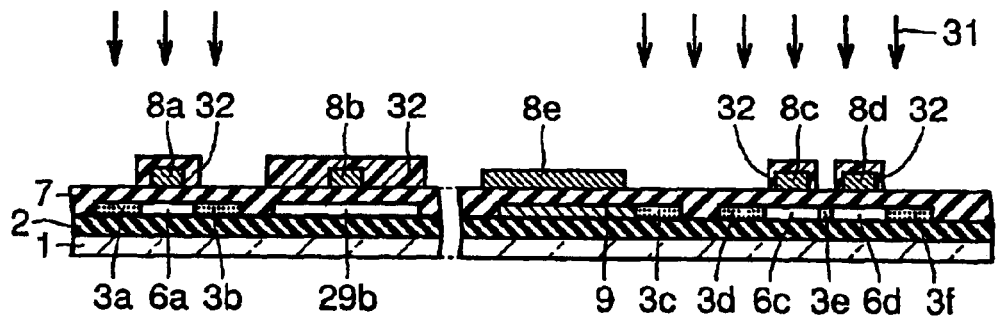

Then, as shown in FIG. 9, a resist film 32 is formed on gate electrodes 8a to 8d. Using resist film 32 as a mask, phosphorus ions 31 are implanted into prescribed regions to form n+ type impurity regions 3a to 3f. Thereafter, resist film 32 is removed.

Figure 10:
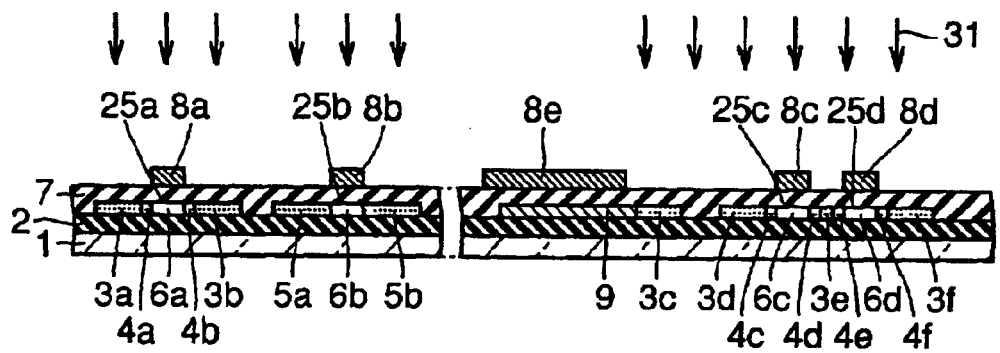

Then, as shown in FIG. 10, using gate electrodes 8a to 8d as a mask, phosphorus ions 31 are implanted into prescribed regions to form n− type impurity regions 4a to 4f.

Figure 11:
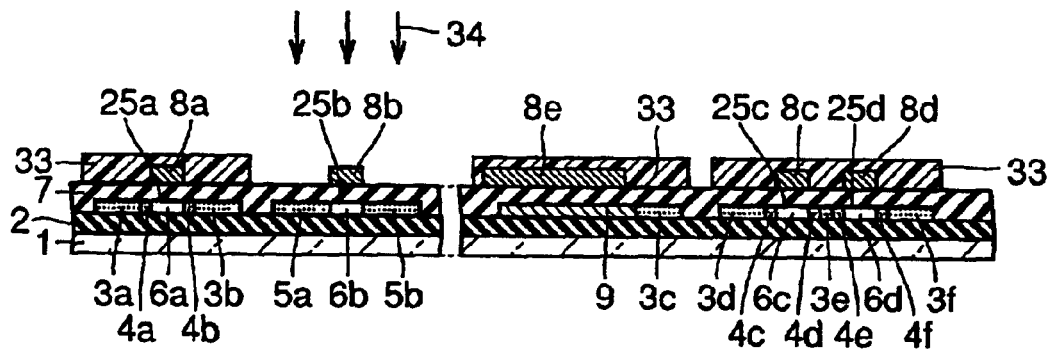

Then, as shown in FIG. 11, a resist film 33 is formed in a region other than the region in which a p-type thin film field-effect transistor 20 is to be formed. Then, using gate electrode 8b as a mask, boron ions 34 are implanted into a prescribed region to form p-type impurity regions 5a, 5b. Thereafter, resist film 33 is removed.

Figure 12:
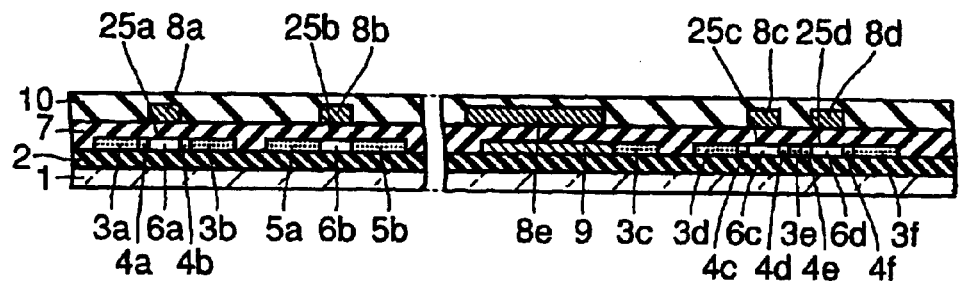

Then, as shown in FIG. 12, an interlayer insulating film 10 is formed on gate electrodes 8a to 8d and capacitance electrode 8e.

Figure 13:
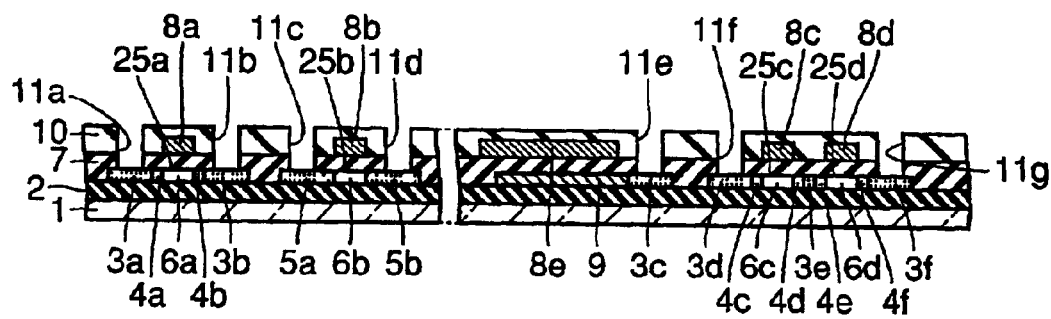

A resist film (not shown) is formed on interlayer insulating film 10. A resist pattern is formed by performing a development processing on the resist film. Parts of interlayer insulating film 10 and insulating film 7 are removed by performing an anisotropic etching using as a mask the resist film in which the resist pattern is formed. In this manner, contact holes 11a to 11g (see FIG. 13) are formed. Thereafter, the resist film is removed. As a result, the structure as the one shown in FIG. 13 is obtained.

Figure 14:
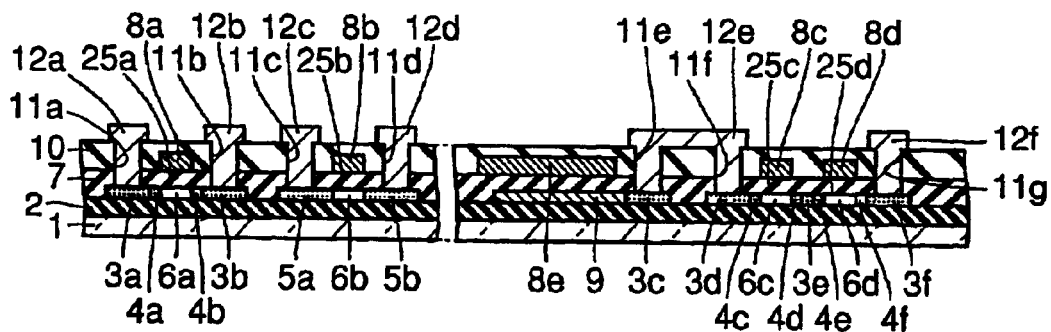

Thereafter, a metal film (not shown) is formed such that it extends from inside contact holes 11a to 11g onto an upper surface of interlayer insulating film 10. A resist film is formed on the metal film. A resist pattern is formed by performing exposure and development processes on the resist film. The metal film is partially removed by performing wet etching using as a mask the resist film in which the resist pattern is formed. In this manner, metal interconnections 12a to 12f (see FIG. 14) are formed. Thereafter, the resist film is removed. As a result, the structure as the one shown in FIG. 14 is obtained.

Figure 15:
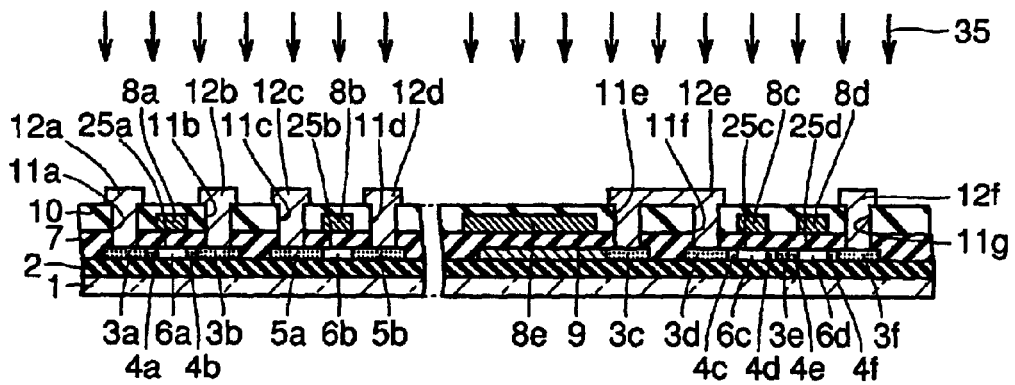
Figure 16:
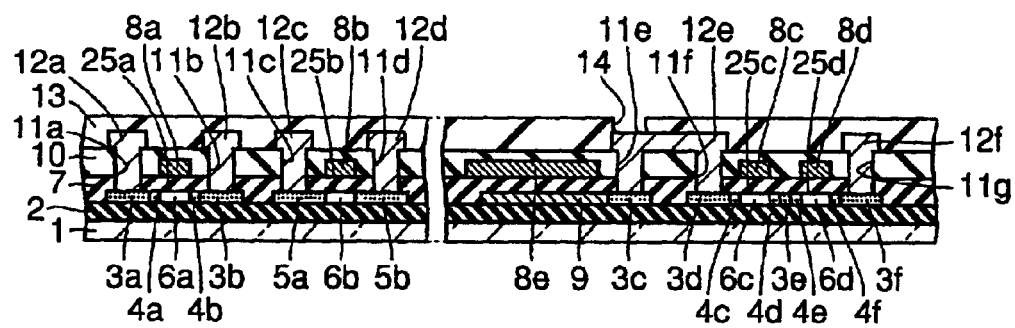

Thereafter, as shown in FIG. 15, hydrogen plasma processing using hydrogen plasma 35 is performed. Then, a passivation film (not shown) is formed on metal interconnections 12a to 12f. A planarized film 13 (see FIG. 16) is formed on the passivation film. A resist film is formed on planarized film 13. A resist pattern is formed by performing exposure and development processes on the resist film. By performing an anisotropic etching using the resist pattern as a mask, parts of planarized film 13 and the passivation film are removed so as to form a contact hole 14 (see FIG. 16). Thereafter, the resist film is removed. In this manner, the structure as the one shown in FIG. 16 is obtained.

Figure 17:
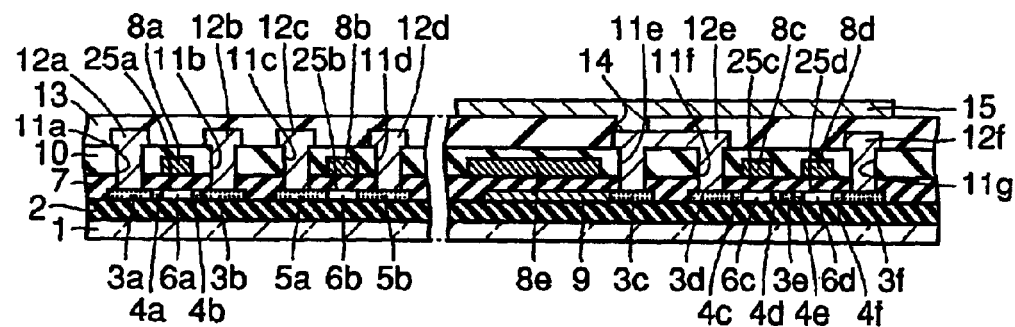

Then, a transparent conductor film such as of ITO is formed such that it extends from inside contact hole 14 onto an upper surface of planarized film 13. A resist film is formed on the transparent conductor film. A resist pattern is formed by performing exposure and development processes on the resist film. By using as a mask the resist film in which the resist pattern is formed, the transparent conductor film is partially removed by etching to form a pixel electrode 15 (see FIG. 17). Thereafter, the resist film is removed. In this manner, the structure as the one shown in FIG. 17 is obtained.

Thereafter, an alignment film 24a (see FIG. 1) is formed on pixel electrode 15. Moreover, an upper glass substrate 18 (see FIG. 1) is prepared on which a color filter 23 (see FIG. 1), an opposite electrode 17 (see FIG. 1), and an alignment film 24b (see FIG. 1) are formed. Further, upper glass substrate 18 is disposed and fixed such that it faces glass substrate 1. Liquid crystal 16 (see FIG. 1) is injected and sealed between alignment films 24a and 24b, and thus, a liquid crystal display device as the one shown in FIG. 1 is obtained.

Second Embodiment

The second embodiment of the method of producing the liquid crystal display device according to the present invention will be described with reference to FIGS. 20 to 23.

Figure 20:
FIGS. 20 to 23 are schematic cross sectional views respectively showing first to fourth steps of a second embodiment of the method of producing a liquid crystal display device according to the present invention.

First, as in the first embodiment of the present invention, an underlying film 2 is formed on a glass substrate 1. An amorphous silicon film 26 (see FIG. 20) of a thickness T3 is formed on underlying film 2. In this manner, the structure as the one shown in FIG. 20 is obtained.

Figure 21:
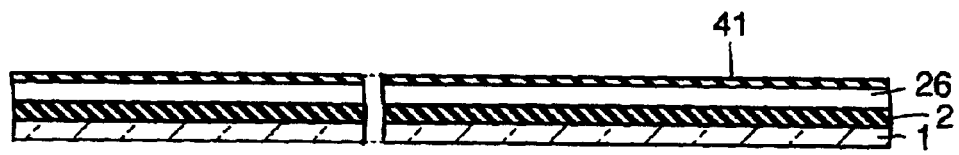

Then, as shown in FIG. 21, an impurity absorption film 41 made of a silicon oxide film is formed.

Figure 22:
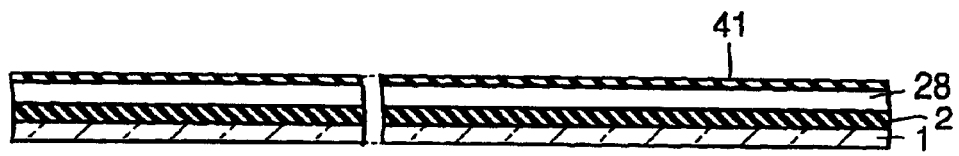

Then, amorphous silicon film 26 is crystallized by annealing. Thus, a polysilicon film 28 is formed as shown in FIG. 22.

Figure 23:
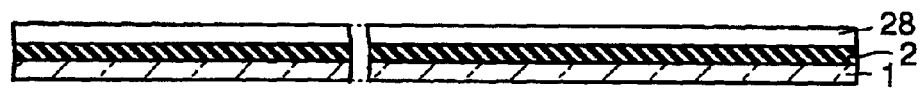

During the annealing, impurities within polysilicon film 28 diffuse from the boundary region between polysilicon film 28 and impurity absorption film 41 into impurity absorption film 41. Then, after the annealing, impurity absorption film 41 is removed by dry etching. As a result, the structure as the one shown in FIG. 23 is obtained. In addition, wet etching may be employed when removing impurity absorption film 41.

Then, after the step shown in FIG. 23, the same steps as those shown in FIGS. 5 to 17 are performed so that a liquid crystal display device having the same structure as the liquid crystal display device shown in FIG. 1 can be easily obtained.

In this manner, in the anneal step, impurities that react more readily with a material composing impurity absorption film 41 than with silicon can be taken into impurity absorption film 41. Consequently, such impurities can be removed from polysilicon film 28. As a result, the same effect as that achieved by the method of producing the liquid crystal display device according to the first embodiment of the present invention can be obtained.

Moreover, in the method of producing the liquid crystal display device according to the first embodiment of the present invention, an upper surface layer of polysilicon film 28 is removed as an impurity concentrated layer so that amorphous silicon film 26 had to be formed from the start to have a thickness that takes into account the extra thickness of the surface layer to be removed. In addition, the laser anneal processing is also performed on the portion of this extra film thickness so that it is required that the output of the laser annealing be made somewhat large. In the method of producing the liquid crystal display device according to the second embodiment of the present invention, however, impurity absorption film 41 is provided so that initially only amorphous silicon film 26 of approximately the required thickness need be formed. In other words, there is no need to form the extra portion of the amorphous silicon film. As a result, it is possible to reduce the energy level used for the anneal processing from the energy level used for the anneal processing in the first embodiment of the present invention. As a result, the manufacturing cost of the liquid crystal display device can be reduced.

Third Embodiment

The third embodiment of the method of producing the liquid crystal display device according to the present invention will be described with reference to FIG. 24.

Figure 24:
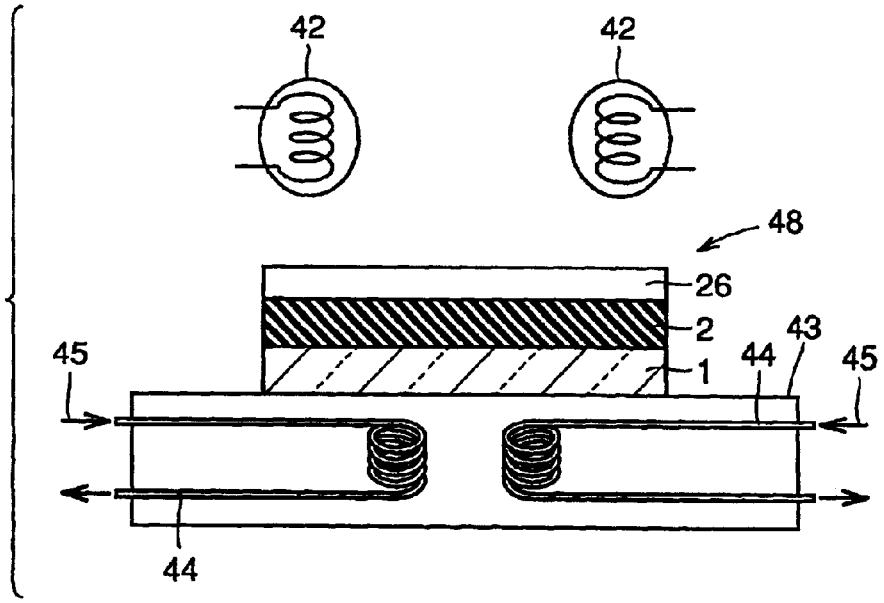

FIG. 24 corresponds to a step of producing a liquid crystal display device shown in FIG. 3 in the first embodiment of the present invention. Thus, as shown in FIG. 24, when performing the laser anneal step, a substrate 48 on which an amorphous silicon film 26 is formed is placed on a table 43. Table 43 is provided with a cooling water tube 44. Cooling water 45 flows through cooling water tube 44. In addition, a heater 42 is disposed above substrate 48 on which the amorphous silicon film is formed. As a result, in amorphous silicon film 26 to be subjected to laser annealing, the temperature in a region close to glass substrate 1 is lower than the temperature in a region close to the upper surface. With such temperature gradient formed, the irradiation of laser 27 (see FIG. 3) onto amorphous silicon film 26 causes the crystallization in polysilicon film 28 (see FIG. 4) gradually to progress from a region close to glass substrate 1. As a result, the upper surface layer of polysilicon film 28 would be the last to crystallize so that the concentration or the segregation of the impurities in the upper surface layer of polysilicon film 28 is ensured. This is because the impurities (contaminants) concentrate or segregate in the grain boundary or in the surface layer of polysilicon film 28 where the crystallization takes place last as described above.

Then, by removing the upper surface layer including impurity concentrated layer 36 (see FIG. 18) of polysilicon film 28 by dry etching or the like as in the first embodiment of the present invention, the removal of such impurity concentrated layer 36 (see FIG. 18) in which impurities are concentrated or segregated can be ensured. As a result, on top of the effect achieved by the first embodiment of the present invention, the reduction of the impurity concentration can be achieved with greater certainty.

Then, after the step shown in FIG. 24, the same steps as those shown in FIGS. 4 to 17 are performed so as to facilitate the production of a liquid crystal display device similar to the liquid crystal display device shown in FIG. 1.

Fourth Embodiment

The fourth embodiment of the method of producing the liquid crystal display device according to the present invention will be described with reference to FIG. 25.

FIG. 25 corresponds to the step shown in FIG. 3 in the first embodiment of the method of producing the liquid crystal display device according to the present invention. In other words, FIG. 25 represents a step of performing laser annealing. According to the fourth embodiment of the present invention, when the laser anneal processing is performed on amorphous silicon film 26, electrodes 46a and 46b are disposed above and below substrate 48, respectively. By connecting a power supply 47 to electrodes 46a, 46b, positive charges are applied to electrode 46b and negative charges are applied to electrode 46a. As a result, an electric field in the direction of an arrow 51 is applied to substrate 48 including amorphous silicon film 26. In this state, the laser annealing is performed by irradiating laser 27 (see FIG. 3) on amorphous silicon film 26.

When amorphous silicon film 26 melts by the irradiation of laser 27, a force is applied to impurity ions within the molten silicon by the electric field in the direction indicated by arrow 51. For instance, impurity ions having positive charges move in the direction of electrode 46a within the molten silicon film due to the force received from the electric field. On the other hand, impurity ions having negative charges move in the direction of electrode 46b. In this manner, the concentration or the segregation of impurity ions having positive charges in the upper surface layer of polysilicon film 28 can be ensured.

Then, after the step shown in FIG. 25, the steps shown in FIGS. 4 to 17 are performed so that a liquid crystal display device similar to the liquid crystal display device shown in FIG. 1 can be easily obtained.

Moreover, in addition to the effect achieved by the method of producing the liquid crystal display device according to the first embodiment of the present invention, the use of the production method shown in FIG. 25 allows impurity ions having positive charges in the upper surface layer of polysilicon film 28 to be concentrated or segregated with certainty so that it becomes possible to ensure the removal of impurity ions of a specific conductivity type (impurity ions having positive charges in the above-described example) from polysilicon film 28 by removing the upper surface layer.

In addition, when the direction of the electric field applied to substrate 48 is changed by changing the sign of electric charges applied to electrodes 46a and 46b, impurity ions having negative charges which are the reverse of the above-described case, for example, can be accumulated in the upper surface layer of polysilicon film 28. In other words, by changing the direction of the electric field applied to substrate 48 by changing the sign of electric charges applied to electrodes 46a and 46b, impurity ions of the desired charge can be concentrated or segregated in the upper surface layer of polysilicon film 28.

Fifth Embodiment

The fifth embodiment of the method of producing the liquid crystal display device according to the present invention will be described with reference to FIG. 26.

FIG. 26, like FIG. 25, corresponds to the laser anneal step shown in FIG. 3. In FIG. 26, substrate 48 is moved when performing the laser annealing. While the laser annealing is performed as substrate 48 is moved, a magnetic field in the direction parallel to a surface of substrate 48 and in a direction of an arrow 52 shown in FIG. 26 is applied to substrate 48 at the same time. In other words, a magnetic field is applied in a direction substantially parallel to the plane of substrate 48 and in a direction perpendicular to the moving direction of substrate 48. In order to produce such a magnetic field, magnetic field producing members 49a, 49b are disposed facing the side surfaces of substrate 48. Electromagnets and the like may be used as magnetic field producing members 49a, 49b.

In this manner, when substrate 48 moves as shown in FIG. 26, a force in a direction toward the surface of substrate 48 (a direction perpendicular to the sheet and toward amorphous silicon film 26 from substrate 1) is applied to impurity ions having positive charges, for instance. Thus, when the laser annealing is performed, impurity ions can be easily concentrated or segregated in the upper surface layer of the polysilicon film. As a result, the same effect as that in the fourth embodiment of the present invention can be achieved.

In addition, magnetic field producing members 49a, 49b are disposed in positions facing the side surfaces of substrate 48 so that there is no need to dispose such magnetic field producing members 49a, 49b above substrate 48 during the laser annealing. Thus, magnetic field producing members 49a, 49b can be prevented from becoming obstacles during the laser irradiation.

After the step shown in FIG. 26, the same steps as those shown in FIGS. 4 to 17 are performed so that a liquid crystal display device having the same structure as the liquid crystal display device shown in FIG. 1 can be easily obtained.

Sixth Embodiment

The sixth embodiment of the method of producing the liquid crystal display device according to the present invention will be described with reference to FIG. 27.

Figure 27:
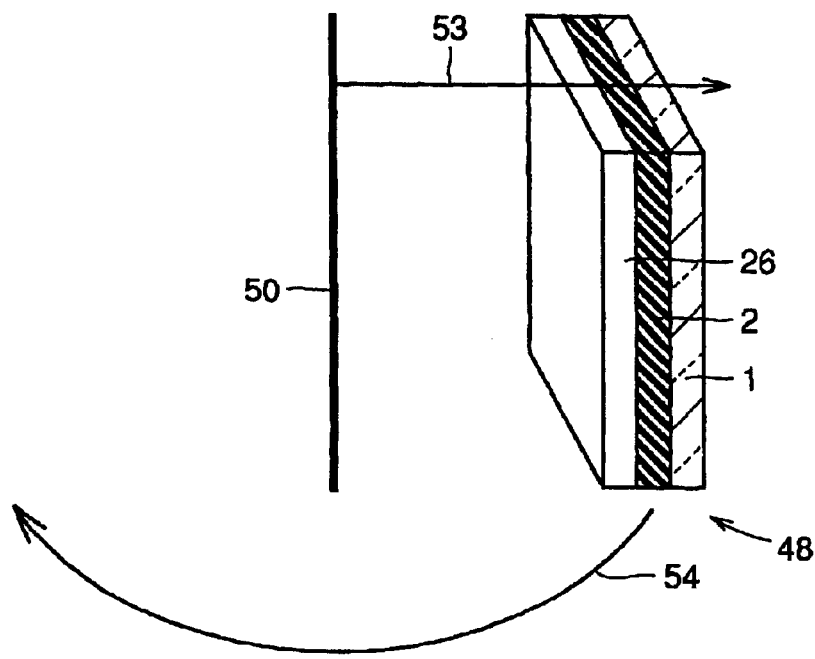

FIG. 27, like FIG. 26 and so on, shows the laser anneal step shown in FIG. 3. In the laser anneal step shown in FIG. 27, however, a rotation movement as shown by an arrow 54 around a central axis 50 is provided to substrate 48. Thus, a centrifugal force in the direction as shown by an arrow 53 is applied to substrate 48. Then, the laser annealing is performed with the centrifugal force applied. Consequently, in the silicon that melted by the irradiation of the laser, an element among the impurity elements that has a smaller specific gravity than silicon moves in the direction toward central axis 50 (a direction from a region adjacent to underlying film 2 within amorphous silicon film 26 toward a region close to the upper surface layer) due to the centrifugal force. As a result, such impurities having a smaller specific gravity than silicon can be further concentrated or segregated into the surface layer (a region close to central axis 50) of the crystallized polysilicon film 28. Moreover, the upper surface layer of polysilicon film 28 is removed by dry etching or the like as in the first embodiment of the present invention. Thereafter, the same steps as those shown in FIGS. 4 to 17 are performed so that a liquid crystal display device having the same structure as the liquid crystal display device shown in FIG. 1 can be easily obtained.

Thus, the use of the method of producing the liquid crystal display device shown in FIG. 27 allows the removal of impurities having a smaller specific gravity in comparison to silicon with greater certainty, while achieving the same effect as the method of producing the liquid crystal display device according to the first embodiment of the present invention.

In addition, in the laser anneal step shown in FIG. 27, if the disposition of substrate 48 is reversed (if amorphous silicon film 26 when seen from glass substrate 1 is disposed such that it is located on the opposite side from central axis 50), impurities having a greater specific gravity than silicon can be concentrated or segregated in a region close to the surface layer of polysilicon film 28.

Moreover, although the laser anneal method is employed here, amorphous silicon film 26 can be heated using a heating furnace and thus made into polysilicon film 28.

Seventh Embodiment

The seventh embodiment of the method of producing the liquid crystal display device according to the present invention will be described with reference to FIG. 28.

Figure 28:
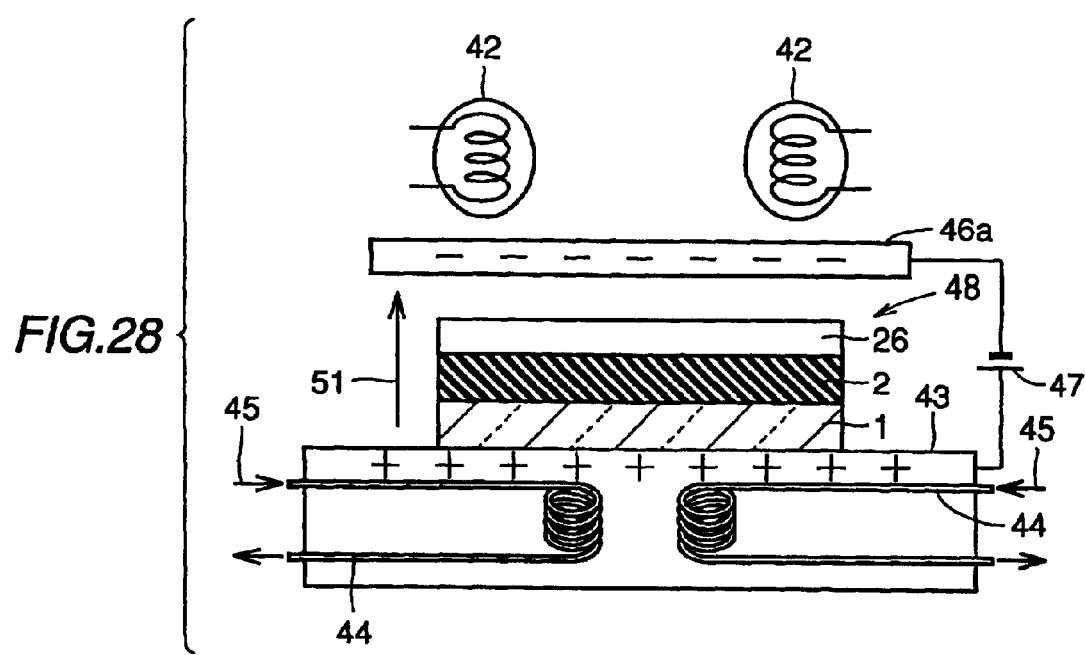

FIG. 28 corresponds to the anneal step shown in FIG. 3. As shown in FIG. 28, when amorphous silicon film 26 is annealed using a laser or the like, an electric field in the direction of an arrow 51 is applied, while at the same time a temperature gradient is formed in amorphous silicon film 26 as in the third embodiment of the present invention with a heater 42 and a table 43 provided with a cooling water tube 44. In this manner, while the effects achieved by the third and fourth embodiments of the present invention can be obtained, two kinds of methods for concentrating or segregating such impurities into a surface layer of polysilicon film 28 are employed together so that the impurities within the polysilicon film can be concentrated or segregated into the upper surface layer in just one anneal step with greater certainty. Then, after the removal by dry etching or the like of the upper surface layer of the polysilicon film in which the impurities are concentrated or segregated, the same steps as those shown in FIGS. 4 to 17 are performed so that a liquid crystal display device having the same structure as the liquid crystal display device shown in FIG. 1 can be easily obtained.

Figure 29:
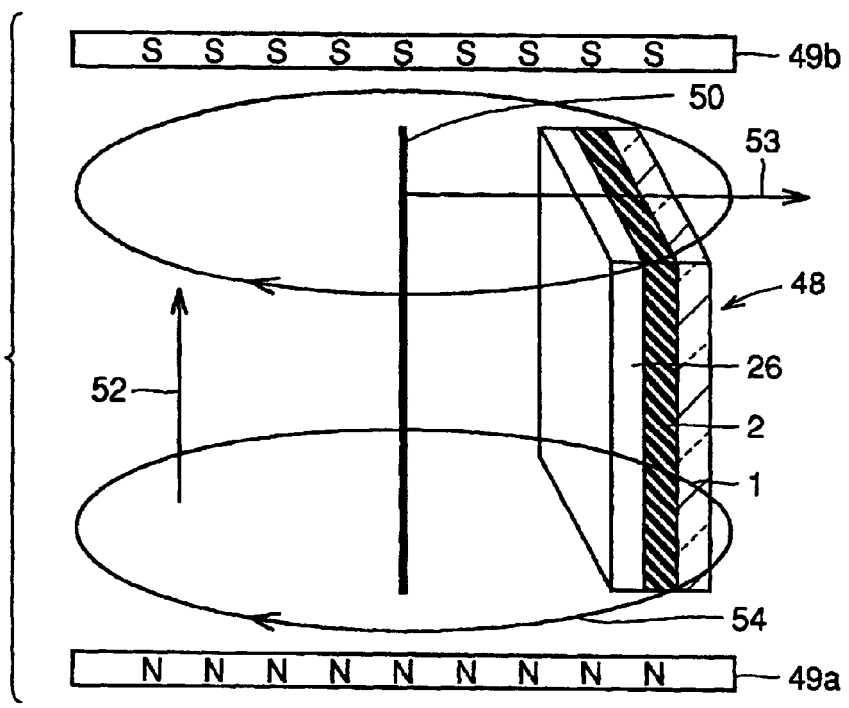
FIGS. 29 and 30 are schematic diagrams respectively showing first and second modifications of the seventh embodiment of the method of producing a liquid crystal display device according to the present invention.

FIG. 29, like FIG. 28, corresponds to the anneal step shown in FIG. 3. In the anneal step shown in FIG. 29, a centrifugal force is applied to amorphous silicon film 26 through the rotation of substrate 48 in the direction of an arrow 54, while at the same time, a magnetic field in a direction shown by an arrow 52 is applied to amorphous silicon film 26 by the disposition of magnetic field producing members 49a and 49b as shown in FIG. 29. In this manner, the same effects as those achieved by the methods of producing the liquid crystal display device shown in the fifth and sixth embodiments of the present invention can be obtained. In addition, the same effect can be obtained as the effect achieved by the method of producing the liquid crystal display device shown in FIG. 28 in which impurities can be positively concentrated or segregated into a surface layer of the polysilicon film in just one anneal step.

Figure 30:
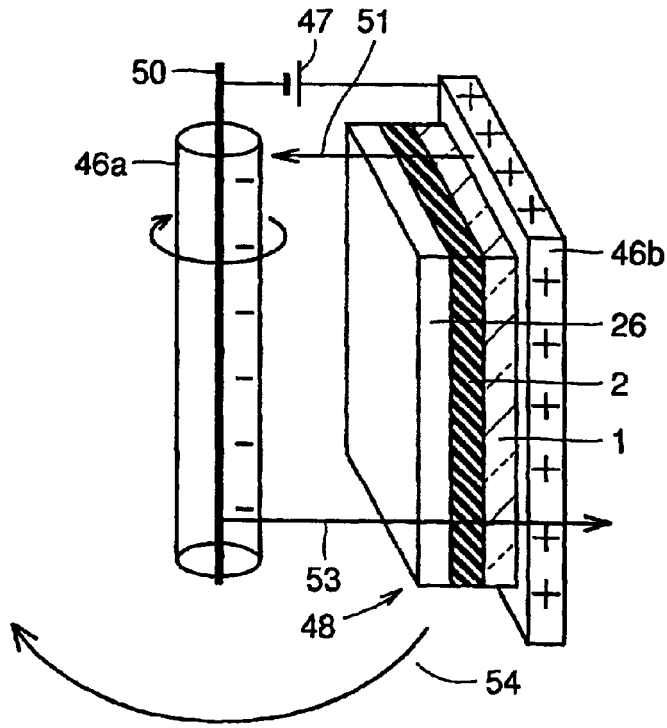

FIG. 30, like FIG. 29, corresponds to the anneal step shown in FIG. 3. In the anneal step shown in FIG. 30, a centrifugal force as shown by an arrow 53 is applied to amorphous silicon film 26 through the rotation of substrate 48 in a direction of an arrow 54, while at the same time, an electric field in a direction as shown by an arrow 51 is applied to amorphous silicon film 26 by the disposition of electrodes 46a and 46b respectively at central axis 50 and in a region located on the opposite side from central axis 50 when seen from substrate 48. The laser annealing performed in such state achieves the same effects as those obtained by the fourth and sixth embodiments of the present invention at the same time in just one anneal step.

After any one of the steps shown in FIGS. 28 to 30 is performed, the surface layer of the polysilicon film in which impurities are concentrated or segregated is removed, and the same steps as those shown in FIGS. 4 to 17 are performed so that a liquid crystal display device having the same structure as the liquid crystal display device shown in FIG. 1 can be easily obtained.

Eighth Embodiment

The eighth embodiment of the method of producing the liquid crystal display device according to the present invention will be described with reference to FIGS. 31 and 32.

Figure 31:
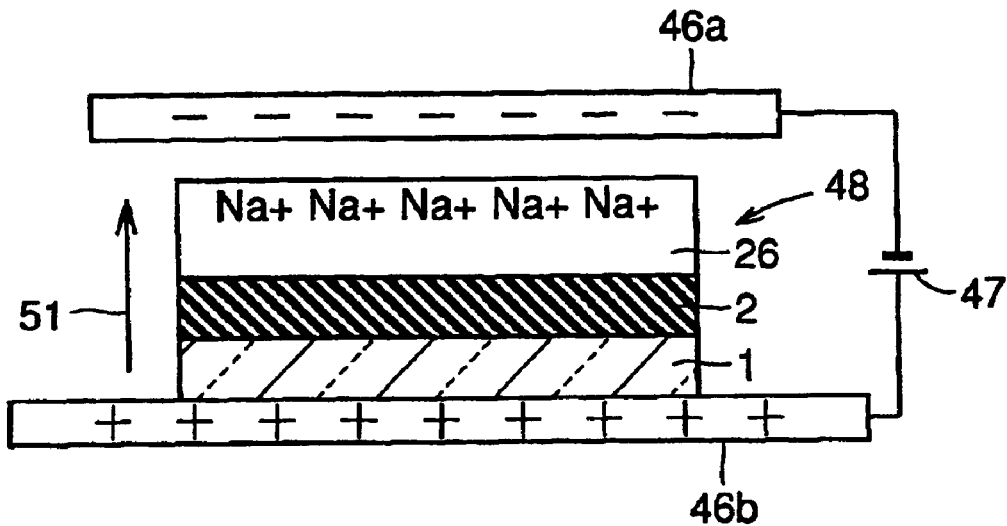
FIGS. 31 and 32 are schematic diagrams respectively showing first and second steps of an eighth embodiment of the method of producing a liquid crystal display device according to the present invention.
Figure 32:
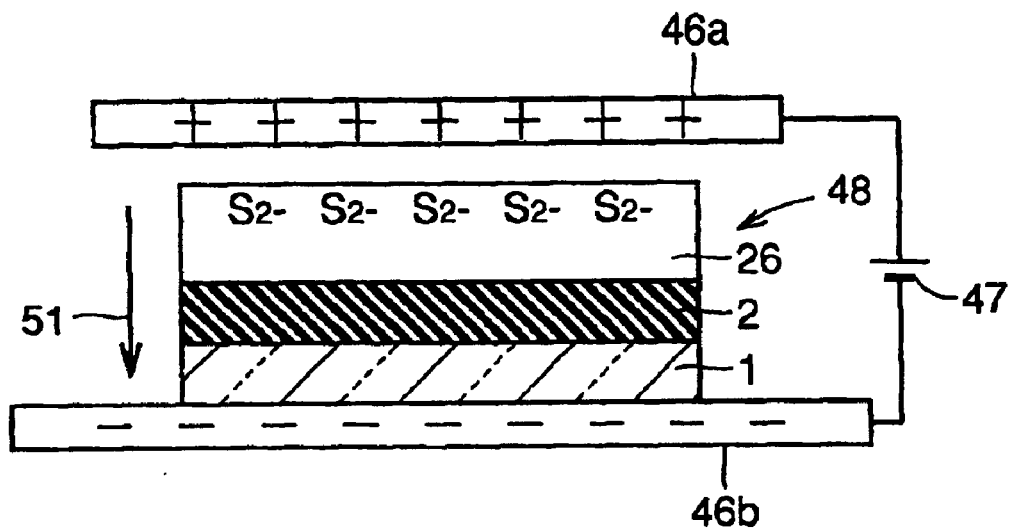

FIGS. 31 and 32 correspond to the anneal step shown in FIG. 3. Thus, after performing the production step shown in FIG. 2, the same step as the anneal step shown in FIG. 25 is performed as shown in FIG. 31 so that impurity ions having positive charges, for instance sodium ions, within the molten silicon film are concentrated or segregated into an upper surface layer of polysilicon film 28. Thereafter, the upper surface layer of polysilicon film 28 in which the impurity ions are concentrated or segregated is removed using dry etching or the like.

Then, as shown in FIG. 32, the charges supplied to electrodes 46a, 46b are changed to charges of the signs that are the reverse of those employed in the step shown in FIG. 31 such that an electric field in a direction as shown by arrow 51 (a direction opposite to the direction of the electric field shown in FIG. 31) is applied to polysilicon film 28. Then in this state, the laser annealing is performed as a further heat treatment. In this manner, impurity ions having negative charges, for example sulfur ions, within the silicon film that is melted by the laser irradiation, concentrate or segregate in the upper surface layer of polysilicon film 28 (in a region close to electrode 46a). Thereafter, the upper surface of polysilicon film 28 is removed once again.

Thus, while the effect achieved by the fourth embodiment of the present invention can be obtained, the removal of both the impurity ions having positive charges and the negative charges within polysilicon film 28 can be ensured.

Then, after the steps shown in FIGS. 31 and 32, the same steps as those shown in FIGS. 4 to 17 are performed so that a liquid crystal display device having the same structure as the liquid crystal display device shown in FIG. 1 can be obtained.

A modification to the method of producing the liquid crystal display device according to the eighth embodiment of the present invention shown in FIGS. 31 and 32 will be described with reference to FIGS. 33 and 34.

Figure 33:
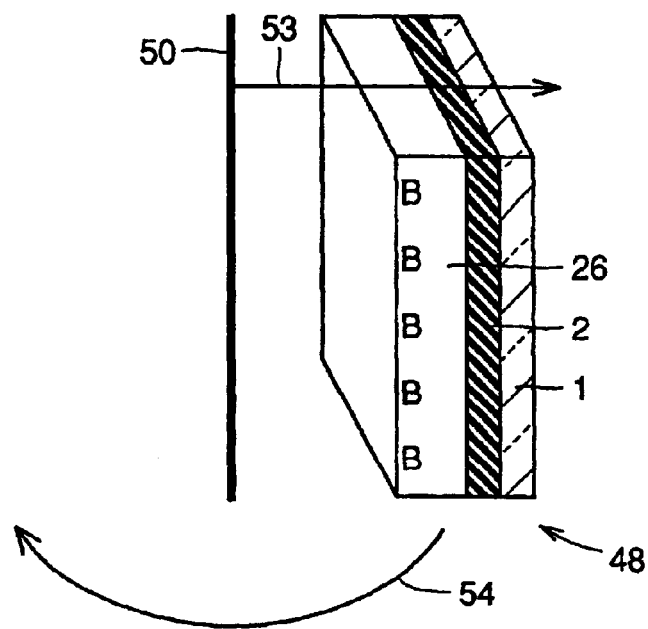
FIGS. 33 and 34 are schematic diagrams respectively showing first and second steps of a modification to the eighth embodiment of the method of producing a liquid crystal display device according to the present invention.

First, as shown in FIG. 33, like the sixth embodiment shown in FIG. 27, the laser anneal step is performed while rotating substrate 48 in a direction shown by an arrow 54 so as to apply a centrifugal force shown by an arrow 53 to amorphous silicon film 26. At this time, like the sixth embodiment, impurities having a smaller specific gravity than silicon, for example boron, are concentrated or segregated in a region close to a surface layer within the molten silicon film (a region which is close to central axis 50 and which is to become the upper surface layer of polysilicon film 28). Thereafter, the surface layer of the crystallized polysilicon film 28 is removed by dry etching or the like. As a result, like the sixth embodiment of the present invention, impurities having a smaller specific gravity than silicon can be removed from polysilicon film 28.

Figure 34:
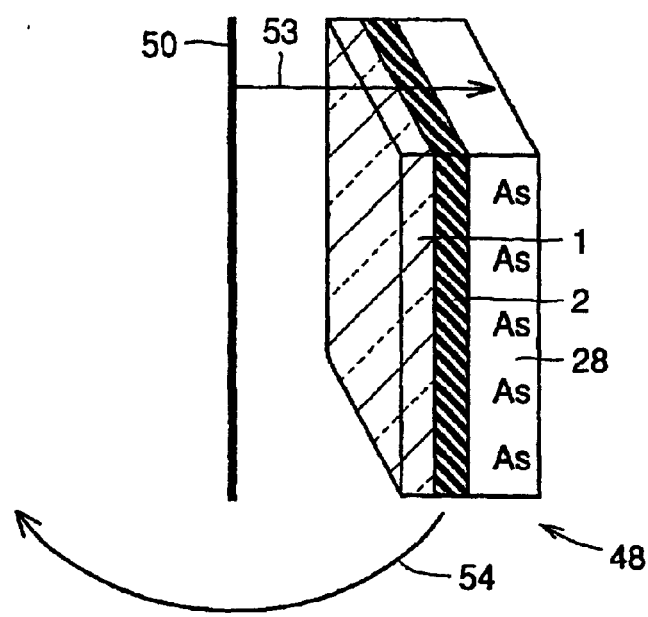

Then, as shown in FIG. 34, unlike the step shown in FIG. 33, substrate 48 is disposed such that polysilicon film 28 when seen from glass substrate 1 is located on the opposite side from central axis 50. Then, a centrifugal force in a direction shown by an arrow 53 is applied to polysilicon film 28 by the rotation of substrate 48 in the direction shown by an arrow 54. In this state, the laser annealing as a further heat treatment is performed on polysilicon film 28. As a result, an impurity element having a greater specific gravity than silicon, for instance arsenic (As) or the like, within the molten silicon, concentrates or segregates in a region close to a surface layer of polysilicon film 28 due to the centrifugal force. Thereafter, the surface layer of polysilicon film 28 is removed by dry etching or the like. As a result, impurities having a greater specific gravity than silicon can be removed from polysilicon film 28.

Thus, the removal of an impurity element having a different specific gravity from that of silicon from polysilicon film 28 can be ensured.

Thereafter, the same steps as those shown in FIGS. 4 to 17 are performed so that a liquid crystal display device having the same structure as the liquid crystal display device shown in FIG. 1 can be obtained.

In addition, here the case in which the step of performing the laser annealing with the application of the electric field is repeated twice and the case in which the step of performing the laser annealing with the centrifugal force applied is repeated twice are shown; however, the same effect can be obtained by twice repeating the step of performing the laser annealing with the application of the magnetic field to substrate 48 as shown in FIG. 26. In a second step of performing the laser annealing with the application of the magnetic field to substrate 48, a direction of the magnetic field is opposite to a direction of the magnetic field in the first step of performing the laser annealing.

In addition, in the first anneal step and the second anneal step, any one of the anneal steps shown in the first to sixth embodiments of the present invention or a combination thereof may be employed, and the anneal method used in the first anneal step and in the second anneal step can be different.

Ninth Embodiment

The ninth embodiment of the method of producing the liquid crystal display device according to the present invention will be described with reference to FIGS. 35 and 36.

First, after performing the same step as the step shown in FIG. 2, like FIG. 3, the laser annealing is performed so as to turn amorphous silicon film 26 into polysilicon film 28. Thereafter, a resist film (not shown) is formed on polysilicon film 28 without removing the upper surface layer of polysilicon film 28. A resist pattern is formed by subjecting the resist film to exposure and development processes. The polysilicon film is partially removed by etching using as a mask the resist film in which this pattern is formed so as to form polysilicon film 29a to 29d (see FIG. 35) which is the semiconductor film portion. Thereafter, the resist film is removed. Thus, the structure as the one shown in FIG. 35 is obtained. At this time, on the upper surface layer of polysilicon film 29a to 29d, impurity concentrated layer 36 (see FIG. 18) in which impurities are concentrated or segregated still remains. Thus, a thickness T1 of polysilicon film 29a to 29d is substantially the same as a thickness T1 of polysilicon film 28 shown in FIG. 3.

Thereafter, the upper surface layer of polysilicon film 29a to 29d is removed using dry etching or the like. Thus, the thickness of polysilicon film 29a to 29d becomes T2, and impurity concentrated layer 36 is removed by the dry etching. As a result, the effect of the first embodiment of the present invention which ensures the reduction of the impurity concentration in polysilicon film 29a to 29d is achieved. At the same time, even when a resist film or the like remains on polysilicon film 29a to 29d in the step shown in FIG. 35, such remaining resist film can be removed at the same time as the removal of the upper surface layer of polysilicon film 29a to 29d by dry etching. As a result, the resist film can be positively prevented from remaining on polysilicon film 29a to 29d.

Figure 35:
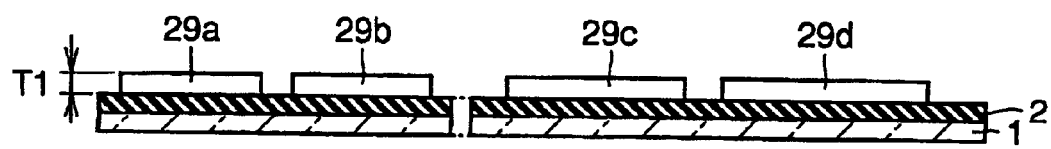
FIGS. 35 and 36 are schematic cross sectional views respectively showing first and second steps of a ninth embodiment of the method of producing a liquid crystal display device according to the present invention.
Figure 36:
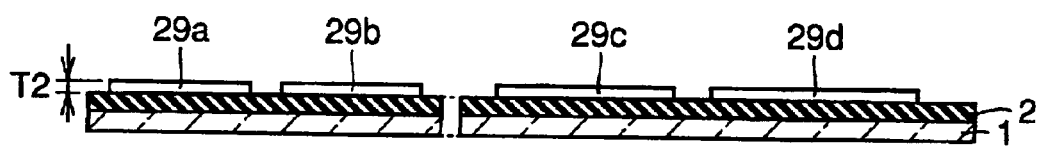

In addition, when impurities and the like are attached in the step shown in FIG. 35 to a region other than the region in which polysilicon film 29a to 29d, which is the semiconductor film portion, is formed (the exposed portion of underlying film 2), the dry etching for removing the upper surface layer of polysilicon film 29a to 29d can remove the impurities attached to the surface of underlying film 2 at the same time. As a result, the prevention of a structural defect in a liquid crystal display device due to the presence of such impurities can be ensured.

Thereafter, the same steps as those shown in FIGS. 6 to 17 are performed so that a liquid crystal display device having the same structure as the liquid crystal display device shown in FIG. 1 can be obtained.

Moreover, any one of the corresponding steps in the second to eighth embodiments of the present invention can be performed in the anneal step for forming polysilicon film 28 corresponding to FIG. 3.

Tenth Embodiment

The tenth embodiment of the method of producing the liquid crystal display device according to the present invention will be described with reference to FIG. 37.

Figure 37:
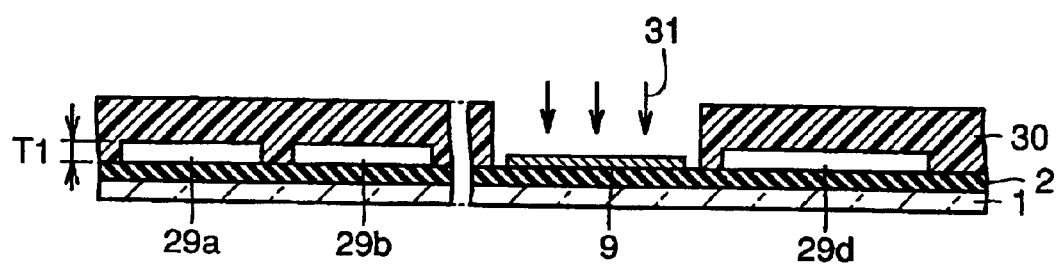
FIG. 37 is a schematic cross sectional view showing a tenth embodiment of the method of producing a liquid crystal display device according to the present invention.
Figure 38:
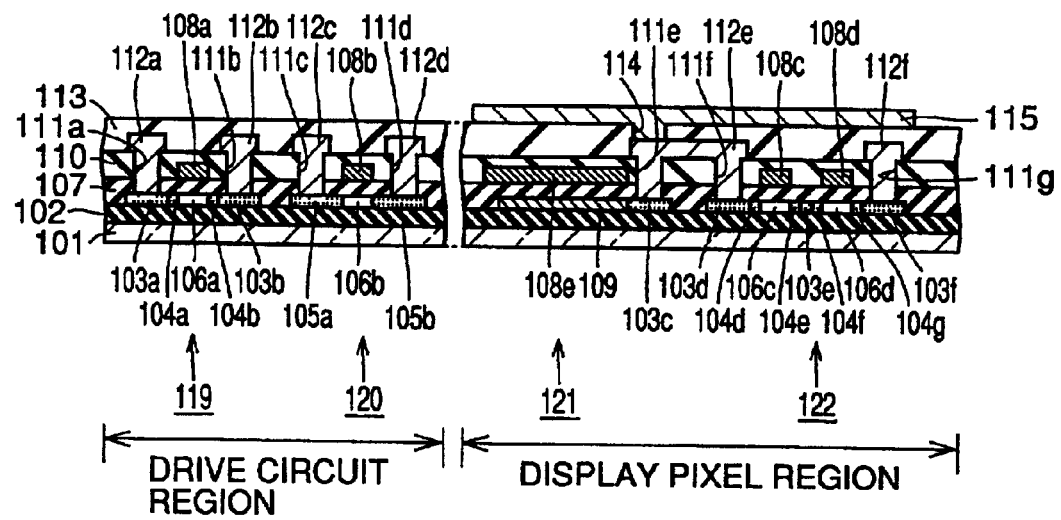
FIG. 38 is a schematic cross sectional view representing a conventional liquid crystal display device.
Figure 39:
FIGS. 39 to 42 are schematic cross sectional views respectively showing first to fourth steps of the method of producing the liquid crystal display device shown in FIG. 38.
Figure 40:
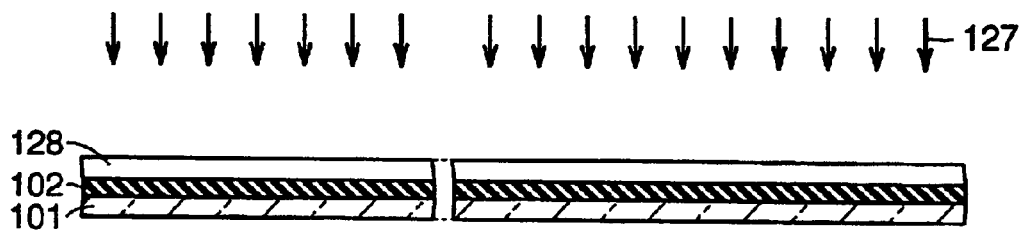
Figure 41:
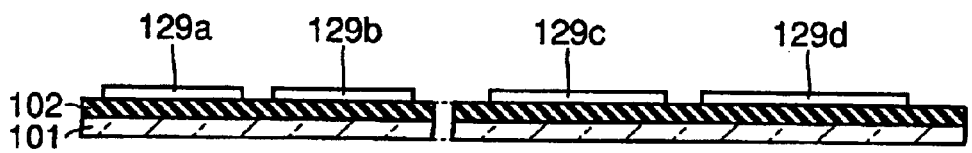
Figure 42:
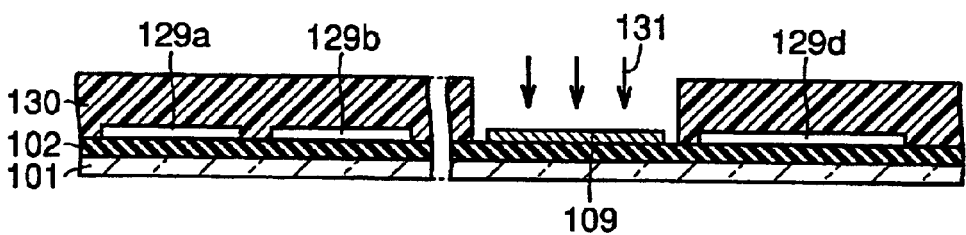
Figure 43:
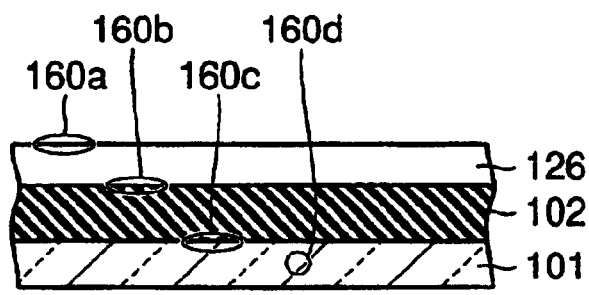
FIGS. 43 to 45 are schematic diagrams related to the description of conventional problems in the art.
Figure 44:
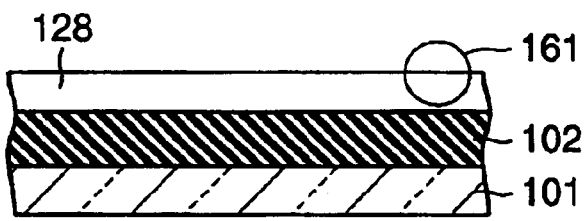
Figure 45:
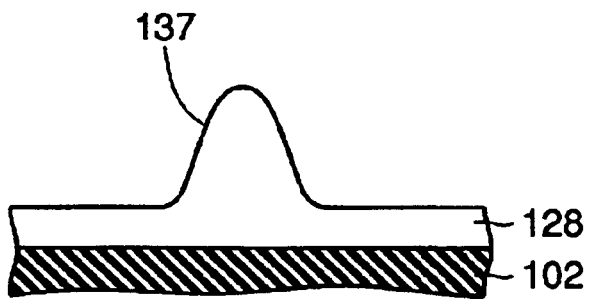

First, after performing the steps shown in FIGS. 2, 3 and 35, like the step shown in FIG. 6, a resist film 30 is formed as shown in FIG. 37 in a region other than the region in which a capacitance 21 is formed. Then, using resist film 30 as a mask, phosphorus ions 31 are implanted into a polysilicon film 29c (see FIG. 35) to form a capacitance electrode 9. At this time, an impurity concentrated layer 36 in which impurities are concentrated or segregated still remains on the upper surface layer of polysilicon film 29a, 29b, 29d.

Thereafter, resist film 30 is removed. Then, the upper surface layer of polysilicon film 29a, 29b, 29d is removed using dry etching or the like. As a result, the same effect as that achieved by the first embodiment of the present invention which ensures the removal of impurities from polysilicon film 29a, 29b, 29d can be obtained. At the same time, if damage is caused to the upper surface layer of polysilicon film 29a, 29b, 29d due to an ashing step for removing resist film 30, the damaged portion can be removed by the dry etching. As a result, the impurity concentration in a channel region of a thin film field-effect transistor formed can be reduced, while a defect caused by the ashing step as described above can be positively prevented from remaining in the channel region. Thereafter, the same steps as those shown in FIGS. 7 to 17 are performed so that a liquid crystal display device having the same structure as the liquid crystal display device shown in FIG. 1 can be obtained.

Moreover, any one of the corresponding steps in the second to eighth embodiments of the present invention can be performed in the anneal step for forming polysilicon film 28 corresponding to FIG. 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a semiconductor device comprising a thin film field-effect transistor including a channel region, the method comprising:

forming an amorphous semiconductor film on a substrate;

heat treating said amorphous semiconductor film by establishing a temperature gradient within said amorphous semiconductor film by lowering temperature in a region of said amorphous semiconductor film adjacent to said substrate to a temperature below a temperature at a surface of said amorphous semiconductor film remote from said substrate, to form, from said amorphous semiconductor film, a crystalline semiconductor film purified by concentrating or segregating impurities within said crystalline semiconductor film into a surface layer of said crystalline semiconductor film, said crystalline semiconductor film including a region that is to become a channel region of a thin film field-effect transistor; and removing the surface layer of said crystalline semiconductor film by dry etching.

2. The method of producing a semiconductor device according to claim 1, including applying a first electric field to said amorphous semiconductor film during the heat treating of said amorphous semiconductor film.

3. The method of producing a semiconductor device according to claim 2, further comprising:

heat treating said crystalline semiconductor film a second time while applying a second electric field in a direction opposite to the first electric field to said crystalline semiconductor film having the surface layer to be removed; and removing the surface layer of said crystalline semiconductor film by dry etching after heat treating the second time.

4. The method of producing a semiconductor device according to claim 1, including applying a first magnetic field to said amorphous semiconductor film during the heat treating of said amorphous semiconductor film.

5. The method of producing a semiconductor device according to claim 4, further comprising:

heat treating said crystalline semiconductor film while applying a second magnetic field in a direction opposite to the first magnetic field to said crystalline semiconductor film having the surface layer to be removed; and removing the surface layer of said crystalline semiconductor film by dry etching after heat treating the second time.

6. The method of producing a semiconductor device according to claim 1, including applying a first centrifugal force to said amorphous semiconductor film during the heat treating of said amorphous semiconductor film.

7. The method of producing a semiconductor device according to claim 6, further comprising:

heat treating said crystalline semiconductor film a second time while applying a second centrifugal force in a direction opposite the first centrifugal force to said crystalline semiconductor film having the surface layer to be removed; and removing the surface layer of said crystalline semiconductor film by dry etching after heat treating the second time.

8. The method of producing a semiconductor device according to claim 1, including, during the heat treating of said amorphous semiconductor film at least two steps selected from the group consisting of:

lowering temperature in a region of said amorphous semiconductor film adjacent to said substrate to a temperature below a temperature at a surface of said amorphous semiconductor remote from said substrate, applying an electric field to said amorphous semiconductor film, applying a magnetic field to said amorphous semiconductor film, and applying a centrifugal force to said amorphous semiconductor film.

9. The method of producing a semiconductor device according to claim 1, comprising forming, prior to removing the surface layer of said crystalline semiconductor film, a semiconductor film portion including a region that is to become the channel region and including the surface layer of said semiconductor film by removing part of said crystalline semiconductor film from said substrate.

10. The method of producing a semiconductor device according to claim 9, wherein forming said semiconductor film portion includes forming a second semiconductor film portion by removing part of said semiconductor film from said substrate, including implanting dopant impurities into said second semiconductor film portion prior to removing the surface layer of said semiconductor film by dry etching.

11. A method of producing a liquid crystal display device using the method of producing a semiconductor device according to claim 1, wherein said substrate is a glass substrate of the liquid display device and said thin film field-effect transistor is part of the liquid crystal display device.

* * * * *

UNITED STATES PATENT AND TRADEMARK OFFICE
CERTIFICATE OF CORRECTION

PATENT NO. : 6,812,071 B2 Page 1 of 1
APPLICATION NO. : 09/799110
DATED : November 2, 2004
INVENTOR(S) : Hayashi et al.

It is certified that error appears in the above-identified patent and that said Letters Patent is hereby corrected as shown below:

Title page, Item
(73) Assignees: Change "Renesas Technology Corp., Tokyo (JP); Seiko Epson Corporation, Tokyo (JP) to --Mitsubishi Denki Kabushiki Kaisha, Tokyo (JP), Seiko Epson Corporation, Tokyo (JP)--.

Signed and Sealed this

First Day of August, 2006

JON W. DUDAS
*Director of the United States Patent and Trademark Office*